(12) United States Patent
Na et al.

(10) Patent No.: US 12,301,236 B2
(45) Date of Patent: May 13, 2025

(54) EQUALIZER FOR REMOVING INTER SYMBOL INTERFERENCE OF DATA SIGNAL BY INCREASING PULSE WIDTHS OF LOGIC LOW LEVEL AND LOGIC HIGH LEVEL OF DATA SIGNAL

(71) Applicant: Samsung Electronics Co., Ltd., Suwon-si (KR)

(72) Inventors: Daehoon Na, Suwon-si (KR); Seonkyoo Lee, Suwon-si (KR); Seungjun Bae, Suwon-si (KR); Taesung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 18/331,223

(22) Filed: Jun. 8, 2023

(65) Prior Publication Data

US 2024/0072773 A1    Feb. 29, 2024

(30) Foreign Application Priority Data

Aug. 26, 2022 (KR) .................. 10-2022-0107558

(51) Int. Cl.
*H03K 3/013* (2006.01)
*G06F 13/16* (2006.01)
*G11C 7/10* (2006.01)
*G11C 7/22* (2006.01)
*H03K 3/017* (2006.01)

(52) U.S. Cl.
CPC .......... *H03K 3/013* (2013.01); *G06F 13/1668* (2013.01); *G11C 7/1093* (2013.01); *G11C 7/222* (2013.01); *H03K 3/017* (2013.01); *G06F 2213/16* (2013.01)

(58) Field of Classification Search
CPC .......... H03K 3/013; H03K 3/017; H03K 7/08; G06F 13/1668; G06F 2213/16; G11C 7/1093; G11C 7/222; G11C 7/1066; G11C 11/4076; G11C 16/32; G11C 7/1048; H04L 25/03878; H04L 25/03834; H04L 25/03343
USPC .................................... 365/230.02
See application file for complete search history.

(56) References Cited

U.S. PATENT DOCUMENTS

| 4,052,563 | A | * | 10/1977 | Noda | ........... G10L 25/00 370/542 |
| 4,479,150 | A | * | 10/1984 | Ilmer | ........... G11B 27/029 386/245 |
| 5,298,899 | A | * | 3/1994 | Oh | ........... H03M 3/042 341/76 |

(Continued)

*Primary Examiner* — Fernando Hidalgo
(74) *Attorney, Agent, or Firm* — Myers Bigel, P.A.

(57) ABSTRACT

An equalizer includes a first pulse width controller that is configured to generate a first signal by increasing a first pulse width of a first data signal having a first logic level, the first data signal corresponding to a current data bit, a second pulse width controller that is configured to generate a second signal by increasing a second pulse width of the first data signal having a second logic level, a first sampler that is configured to generate a first sampled signal by sampling the first signal, a second sampler that is configured to generate a second sampled signal by sampling the second signal, and a multiplexer that is configured to output the first sampled signal or the second sampled signal based on a value of a previous data bit.

20 Claims, 15 Drawing Sheets

(56) References Cited

U.S. PATENT DOCUMENTS

| | | |
|---|---|---|
| 7,596,175 B2* | 9/2009 | Chen .................. H04L 1/242 |
| | | 375/232 |
| 9,444,437 B2 | 9/2016 | Bulzacchelli et al. |
| 9,577,848 B1 | 2/2017 | Chattopadhyay et al. |
| 10,075,308 B2 | 9/2018 | Li et al. |
| 10,454,723 B1 | 10/2019 | Kossel et al. |
| 10,545,889 B1 | 1/2020 | Fazeel et al. |
| 10,587,256 B2 | 3/2020 | Lee |
| 10,958,484 B1 | 3/2021 | Fazeel et al. |
| 2022/0158439 A1* | 5/2022 | Feng .................. H01L 27/0251 |
| 2022/0215865 A1 | 7/2022 | Woo et al. |

* cited by examiner

EQUALIZER FOR REMOVING INTER SYMBOL INTERFERENCE OF DATA SIGNAL BY INCREASING PULSE WIDTHS OF LOGIC LOW LEVEL AND LOGIC HIGH LEVEL OF DATA SIGNAL

CROSS-REFERENCE TO RELATED APPLICATIONS

This application claims priority under 35 U.S.C. § 119 to Korean Patent Application No. 10-2022-0107558, filed on Aug. 26, 2022, in the Korean Intellectual Property Office, the disclosure of which is incorporated by reference herein in its entirety.

BACKGROUND

Embodiments of the present disclosure described herein relate to an equalizer for removing an inter symbol interference (ISI) of a data signal by increasing a pulse width corresponding to each of a logic low level and a logic high level of the data signal.

A semiconductor memory device is classified as a volatile memory device in which stored data are lost when power is turned off or a non-volatile memory device in which stored data are retained even when power is turned off.

Data stored in the semiconductor memory device may be provided to an external device (e.g., a memory controller) through a signal line. For example, the semiconductor memory device may send data to a memory controller in synchronization with a data strobe signal. In this case, signals may be distorted based on characteristics of lines between the semiconductor memory device and the memory controller. The signal distortion may cause a decrease in a data transmission speed or a decrease in data reliability.

SUMMARY

Embodiments of the present disclosure provide an equalizer configured to remove an inter symbol interference (ISI) of a data signal by increasing a pulse width corresponding to each of a logic low level and a logic high level of the data signal.

According to an embodiment, an equalizer includes a first pulse width controller that is configured to generate a first signal by increasing a first pulse width of a first data signal having a first logic level, the first data signal corresponding to a current data bit, a second pulse width controller that is configured to generate a second signal by increasing a second pulse width of the first data signal having a second logic level, a first sampler that is configured to generate a first sampled signal by sampling the first signal, a second sampler that is configured to generate a second sampled signal by sampling the second signal, and a multiplexer that is configured to output the first sampled signal or the second sampled signal based on a value of a previous data bit.

According to an embodiment, an equalizer includes a first pulse width controller that is configured to generate a first signal by increasing a first pulse width of a first data signal having a first logic level, the first data signal corresponding to a current data bit, a second pulse width controller that is configured to generate a second signal by increasing a second pulse width of the first data signal having a second logic level, a first multiplexer that is configured to output the first signal or the second signal based on a value of a first previous data bit, and a first sampler that is configured to sample a signal output from the first multiplexer.

According to an embodiment, an equalizer includes a first pulse width controller that is configured to generate a first signal by increasing a first pulse width of a first data signal having a first logic level, the first data signal corresponding to a current data bit, a second pulse width controller that is configured to generate a second signal by increasing a second pulse width of the first data signal having a second logic level, a third pulse width controller that is configured to generate a third signal by increasing the first pulse width, a fourth pulse width controller that is configured to generate a fourth signal by increasing the second pulse width, a first sampler that is configured to generate a first sampled signal by sampling the first signal based on a point in time of a falling edge of a data strobe signal, a second sampler that is configured to generate a second sampled signal by sampling the second signal based on the point in time of the falling edge of the data strobe signal, a third sampler that is configured to generate a third sampled signal by sampling the third signal based on a point in time of a rising edge of the data strobe signal, a fourth sampler that is configured to generate a fourth sampled signal by sampling the fourth signal based on the point in time of the rising edge of the data strobe signal, a first multiplexer that is configured to output the first sampled signal or the second sampled signal based on a signal output from a second multiplexer, and a second multiplexer that is configured to output the third sampled signal or the fourth sampled signal based on a signal output from the first multiplexer.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
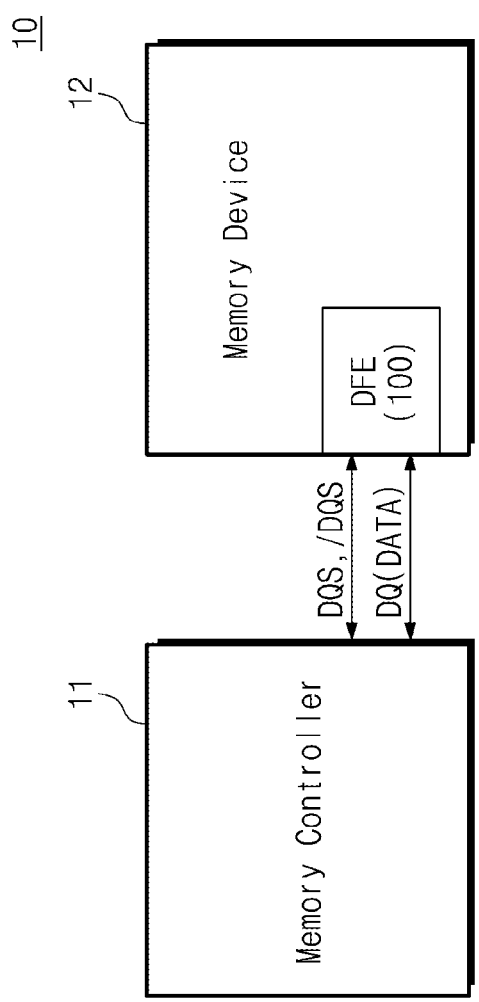
FIG. 1 is a block diagram illustrating a memory system according to an embodiment of the present disclosure.

Hereinafter, example embodiments will be described in detail with reference to the accompanying drawings. The present disclosure may, however, be embodied in many different forms and should not be construed as limited to the embodiments set forth herein. Like reference numerals refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

The terms ""unit,"" "module," etc., which are used herein and functional blocks illustrated in the drawings may be implemented in the form of a software component, a hardware component, or a combination thereof. Below, to describe the technical idea of embodiments of the inventive concept clearly, the repeated description associated with the same components will be omitted.

FIG. 1 is a block diagram illustrating a memory system according to an embodiment of the present disclosure. Referring to FIG. 1, a memory system 10 may include a memory device 12 and a memory controller 11. The memory device 12 may be a NAND flash memory device, but embodiments of the present disclosure are not limited thereto. For example, the memory device 12 may be a volatile memory device such as a dynamic random access memory (DRAM) device or a non-volatile memory device such as a NAND flash memory device.

Under control of the memory controller 11, the memory device 12 may store data "DATA" or may transmit the stored data "DATA" to the memory controller 11. For example, the memory device 12 may provide the data "DATA" to the memory controller 11 in synchronization with a data strobe signal provided through a data strobe line DQS. In an embodiment, the data "DATA" may be exchanged between the memory device 12 and the memory controller 11 through a plurality of data lines DQ and the data strobe line DQS.

The memory controller 11 may receive the data "DATA" from the memory device 12 through the data lines DQ. For example, the memory controller 11 may identify the data "DATA" received through the data lines DQ based on a signal of the data strobe line DQS. The memory controller 11 may receive a complementary data strobe signal through a complementary data strobe line /DQS. The complementary data strobe signal may refer to a signal whose phase is opposite to that of the data strobe signal. The complementary data strobe signal may be communicated between the memory controller 11 and the memory device 12.

In an embodiment, the memory device 12 and the memory controller 11 may communicate with each other based on a single data rate (SDR) or double data rate (DDR) interface. However, embodiments of the present disclosure are not limited thereto. For example, the memory device 12 and the memory controller 11 may communicate with each other based on one or more interfaces, such as, but not limited to, a universal serial bus (USB) interface, a multimedia card (MMC) interface, a peripheral component interconnection (PCI) interface, a PCI-express (PCI-E) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a NAND interface.

The memory device 12 may include decision feedback equalization (DFE) 100. The DFE 100 may be configured to perform an inter symbol interference (ISI) removing operation. DFE 100 can be implemented as an equalizer. In some embodiments, the DFE 100 may be configured to generate a first signal and a second signal by respectively increasing a portion of a data signal corresponding to a first logic level and a portion of the data signal corresponding to a second logic level. The data signal may be received from the memory controller 11. Also, the DFE 100 may select the first signal or the second signal based on a previously received data bit. As the DFE 100 increases the portion of the data signal corresponding to the first logic level and the portion of the data signal corresponding to the second logic level, respectively, a valid data window, which may be degraded by the ISI, may be compensated for.

As such, an effective margin for identifying a data bit may be sufficiently secured at a receive stage of the memory device 12. Accordingly, the memory device 12 that supports a high-speed interface may receive and process data from the memory controller 11 with fewer errors, and thus, the reliability of the memory device 12 is improved.

Figure 2:
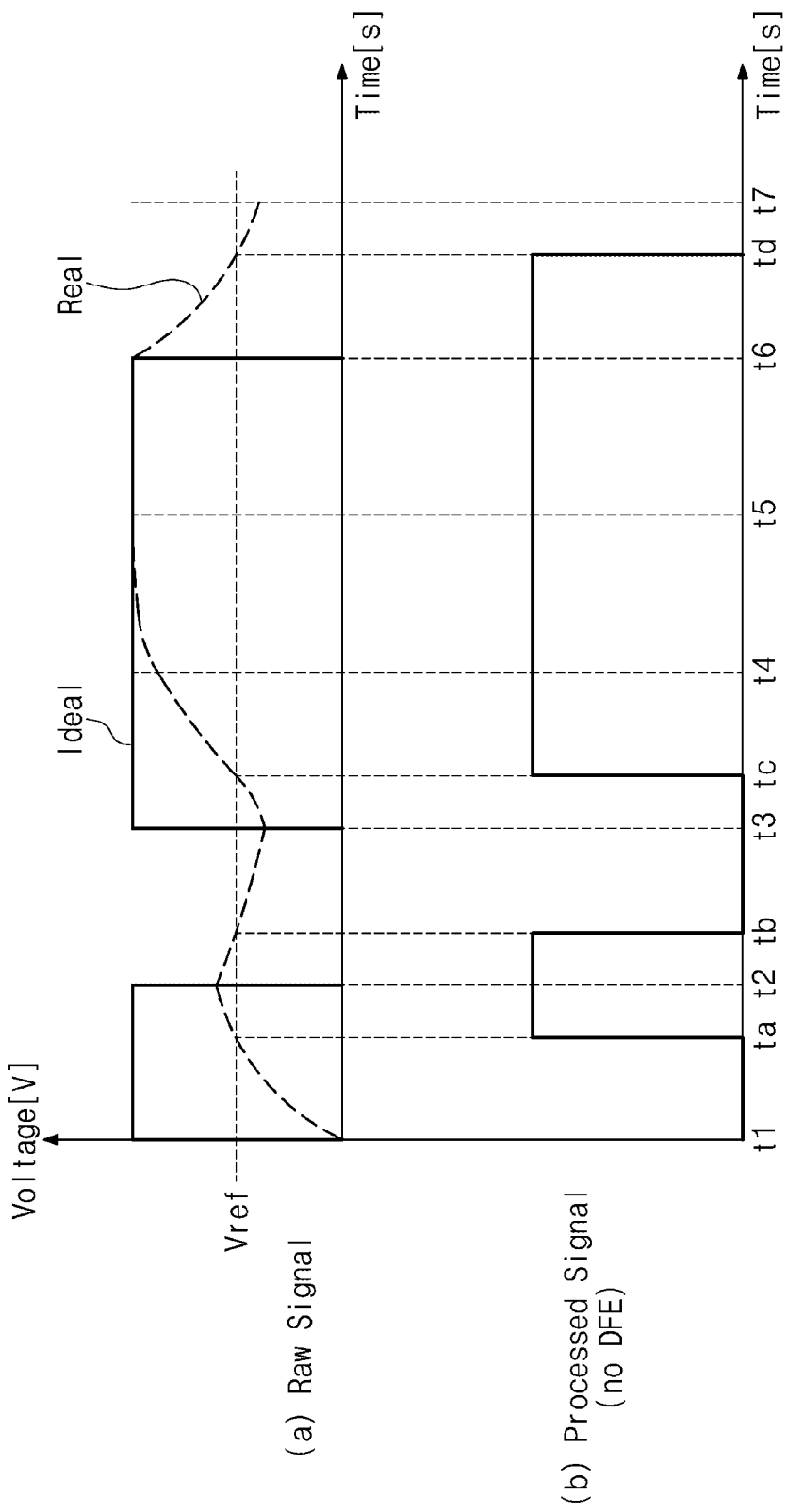
FIG. 2 is a timing diagram illustrating data signals according to an embodiment of the present disclosure.

FIG. 2 is a timing diagram illustrating data signals according to an embodiment of the present disclosure. Referring to FIGS. 1 and 2, a raw data signal and a processed data signal are illustrated. The raw data signal may refer to a signal that the memory device 12 receives from the memory controller 11. The processed data signal may refer to a signal that is generated by the memory device 12 by comparing the raw data signal with a reference voltage Vref. In FIG. 2, a horizontal axis represents time, and a vertical axis represents voltage.

Referring to the view (a) of FIG. 2 corresponding to the raw data signal, an ideal graph and a real graph are illustrated. Referring to the ideal graph, the raw data signal may have the first logic level between a first time t1 and a second time t2, may have the second logic level between the second time t2 and a third time t3, may have the first logic level between the third time t3 and a sixth time t6, and may have the second logic level between the sixth time t6 and a seventh time t7. In some embodiments, the first logic level may refer to the logic high level, and the second logic level may refer to the logic low level.

However, adjacent symbols may overlap and interfere due to the influence of the channel through which the data signal is communicated, which may cause ISI. As such, the real graph may be different in shape from the ideal graph. For example, referring to the ideal graph, the raw data signal has the second logic level between the second time t2 and the third time t3. However, referring to the real graph, the raw data signal has a voltage level between the first logic level and the second logic level between the second time t2 and the third time t3.

The memory device 12 may be configured to generate the processed signal by comparing the raw data signal illustrated in the real graph with the reference voltage Vref. For example, referring to the real graph, in response to that the voltage of the raw data signal is less than the reference voltage Vref between the first time t1 and an a-th time ta, the memory device 12 may be configured to generate the processed signal having the second logic level between the first time t1 and the a-th time ta. Based on the voltage of the raw data signal being greater than the reference voltage Vref between the a-th time ta and a b-th time tb, the memory device 12 may be configured to generate the processed signal having the first logic level between the a-th time ta and the b-th time tb. The processed signal may refer to a signal that is processed without using the DFE.

Referring to the ideal graph and a graph of the processed signal, a width of a valid data window in the graph of the processed signal may be smaller than that in the ideal graph. For example, referring to the ideal graph, the raw data signal may have the first logic level between the first time t1 and the second time t2; however, referring to the graph of the processed signal, the processed signal may have the first logic level between the a-th time ta and the b-th time tb, the width of which is smaller than that of the first logic level between the first time t1 and the second time t2.

As described above, because the width of the valid data window in the graph of the processed signal is smaller than the width of the valid data window in the ideal graph, the valid margin for identifying the data bit may not be sufficiently secured. That is, the memory device 12 may fail to normally receive data from the memory controller 11.

As such, according to some embodiments, a DFE may be used that is configured to remove the ISI of the processed signal, such that the valid margin for identifying the data bit is sufficiently secured.

Figure 3:
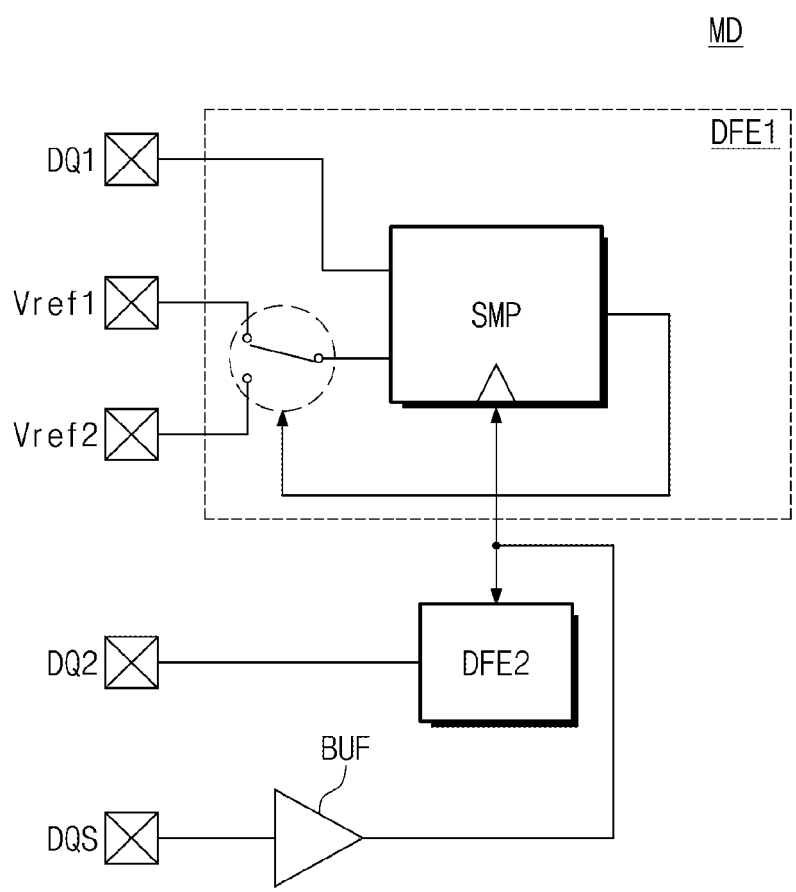
FIG. 3 is a block diagram illustrating a conventional memory device.

FIG. 3 is a block diagram illustrating a conventional memory device. Referring to FIGS. 1 and 3, a conventional memory device MD includes a buffer BUF, a first DFE DFE1, and a second DFE DFE2.

The memory device MD may be configured to receive the data "DATA" from the memory controller 11 through first and second data lines DQ1 and DQ2 and may process the data "DATA" through the first DFE DFE1 and the second DFE DFE2. The data strobe signal received through the data strobe line DQS may be used as a clock signal for processing the data "DATA". The buffer BUF may be configured to adjust the timing when the data strobe signal is communicated between the first DFE DFE1 and the second DFE DFE2.

The first DFE DFE1 may include a sampler SMP and a switch SW. The first DFE DFE1 may be configured to determine a reference voltage corresponding to the currently received data based on the previously received data. In detail, when the previously received data have the first logic level, the switch SW may be configured to operate to receive a first reference voltage Vref1. The first DFE DFE1 may be configured to determine the logic level of the currently received data based on the first reference voltage Vref1.

When the previously received data have the second logic level, the switch SW may be configured to operate to receive a second reference voltage Vref2. The first DFE DFE1 may be configured to determine the logic level of the currently received data based on the second reference voltage Vref2. The first reference voltage Vref1 may be higher than the second reference voltage Vref2. The second DFE DFE2 may be configured to operate to be similar to the first DFE DFE1.

As described above, each of the first DFE DFE1 and second DFE DFE2 of the conventional memory device MD may be configured to determine the reference voltage for evaluating the logic level of the currently received data, based on the previously received data. As such, in the first DFE DFE1 and second DFE DFE2 of the conventional memory device MD, there is a need to feed the previously received data back to the switch SW at a time to decide the logic level of the currently received data. That is, the first DFE DFE1 and second DFE DFE2 of the conventional memory device MD may require the feedback within a unit interval (1 UI).

When it is impossible to transfer the previously received data from the sampler SMP to the switch SW within the 1 UI, the operations of the first and second DFEs DFE1 and DFE2 may not be performed. A memory device that complies with the NAND flash interface standard may be different in structure from the conventional memory device MD illustrated in FIG. 3 and may be impossible to feed back the previously received data within the 1 UI. That is, it may be impossible to remove the ISI influence of the received data even though the first DFE DFE1 and the second DFE DFE2 are applied to the conventional memory device MD illustrated in FIG. 3. As such, a DFE capable of removing the ISI influence may be required in a structure where the feedback is impossible within the 1 UI.

Figure 4:
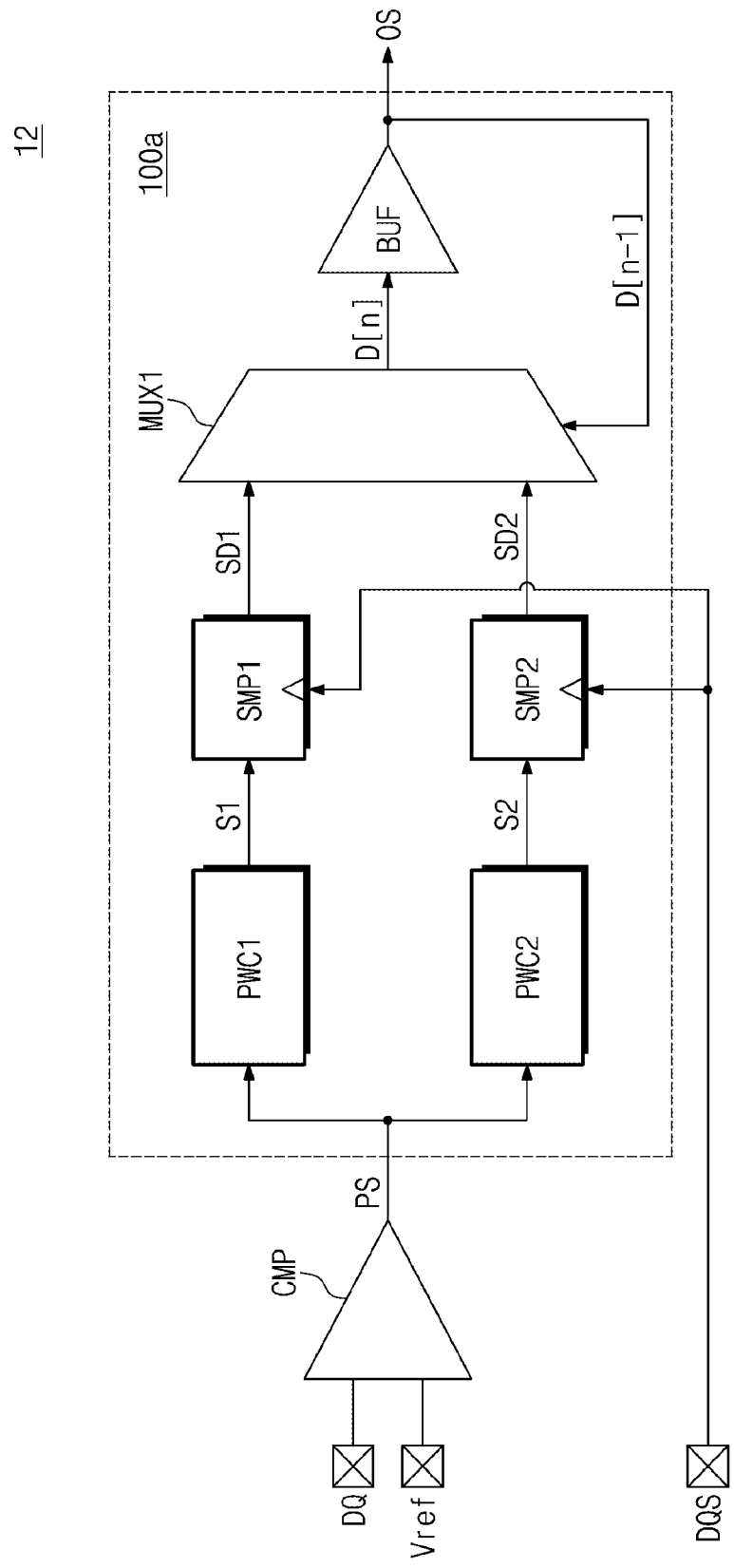
FIG. 4 is a block diagram illustrating a memory device according to an embodiment of the present disclosure.

FIG. 4 is a block diagram illustrating a memory device according to an embodiment of the present disclosure in detail. Referring to FIGS. 1 and 4, the memory device 12 may include a comparator CMP and a DFE 100a. DFE 100a can be implemented as an equalizer. For convenience of description and for brevity of illustration, components of the memory device 12 are conceptually illustrated, and some unnecessary components are omitted. The DFE 100a may correspond to the DFE 100 of FIG. 1.

The memory device 12 may receive a plurality of data bits from the memory controller 11 through the data line DQ. For example, the memory device 12 may sequentially receive data bits D[n−1] and D[n] through the data line DQ. The data bits D[n−1] and D[n] may be provided from the memory controller 11 in synchronization with the data strobe signal received through the data strobe line DQS. Also, it is assumed that a data bit of "1" indicates a data signal of the logic high level a data bit of "0" indicates a data signal of the logic low level. Herein, "n" is a natural number of 1 or more.

The data signal corresponding to the first previous data bit D[n−1] may be received from the memory controller 11 before the unit time period compared to the data bit corresponding to the current data bit D[n]. The memory device 12 may receive a signal corresponding to one data bit per unit time period. For example, referring to FIG. 2, the memory device 12 may receive the signal corresponding to the first previous data bit D[n−1] between the first time t1 and the second time t2 and may receive the signal corresponding to the current data bit D[n] between the second time t2 and the third time t3.

The above terms having a time meaning such as "current" and "previous" are simply for describing the technical idea of present disclosure, and the terms do not limit a specific point in time. For example, the DFE 100a may generate the current data bit D[n] by performing the ISI removing operation on the data signal received between the second time t2 and the third time t3; however, the DFE 100a may be configured to perform the ISI removing operation on the data signal received between the third time t3 and the fourth time t4. Also, when the DFE 100a performs the ISI removing operation on the data signal received between the third time t3 and the fourth time t4, the data signal received between the second time t2 and the third time t3 may correspond to the previous data signal.

The comparator CMP may be configured to generate a processed signal PS based on the reference voltage Vref by comparing the data signal received from the memory controller 11 with the reference voltage Vref. The processed signal PS may refer to the processed signal of FIG. 2. The processed signal PS may refer to a signal corresponding to the current data bit D[n]. A portion of the received data signal whose voltage is higher than the reference voltage Vref may be processed by the comparator CMP as having the first logic level; a portion of the received data signal whose voltage is lower than the reference voltage Vref may be processed by the comparator CMP as having the second logic level.

Below, a structure of the DFE 100a will be described. The DFE 100a may be configured to perform the ISI removing operation on the processed signal PS corresponding to the current data bit D[n] and may output an output signal OS. The DFE 100a may include a first pulse width controller PWC1, a second pulse width controller PWC2, a first sampler SMP1, a second sampler SMP2, a first multiplexer MUX1, and a buffer BUF.

The first pulse width controller PWC1 may be configured to generate a first signal S1 by increasing the pulse width of the processed signal PS, which corresponds to the first logic level. For example, the first pulse width controller PWC1 may increase the pulse width of the processed signal PS, which corresponds to the logic high level, as much as a first time interval. This will be described in detail with reference to FIG. 5.

The second pulse width controller PWC2 may be configured to generate a second signal S2 by increasing the pulse width of the processed signal PS, which corresponds to the second logic level. For example, the second pulse width controller PWC2 may increase the pulse width of the processed signal PS, which corresponds to the logic low level, as much as the first time interval. This will be described in detail with reference to FIG. 6.

The first sampler SMP1 may be configured to sample the first signal S1 based on the data strobe signal. The first sampler SMP1 may be configured to generate a first sampled signal SD1 from the first signal S1 based on the data strobe signal. This will be described in detail with reference to FIG. 7.

The second sampler SMP2 may be configured to sample the second signal S2 based on the data strobe signal. The second sampler SMP2 may be configured to generate a second sampled signal SD2 from the second signal S2 based on the data strobe signal. This will be described in detail with reference to FIG. 8.

The first multiplexer MUX1 may output one of the first sampled signal SD1 and the second sampled signal SD2 based on a value of the first previous data bit D[n−1]. In some embodiments, when the first previous data bit D[n−1] has a first value, the first multiplexer MUX1 may output the second sampled signal SD2. For example, the first value may be "1". In this case, the current data bit D[n] may correspond to the second sampled signal SD2.

When the first previous data bit D[n−1] has a second value, the first multiplexer MUX1 may output the first sampled signal SD1. For example, the second value may be "0". In this case, the current data bit D[n] may correspond to the first sampled signal SD1. This will be described in detail with reference to FIG. 9.

The buffer BUF may be configured to adjust the time to output the signal received from the first multiplexer MUX1. When the DFE 100a processes the data signal corresponding to the current data bit D[n], the buffer BUF may output the first previous data bit D[n−1] whose ISI removing operation is completed before the unit time period, to the first multiplexer MUX1.

As described above, unlike the first DFE DFE1 of FIG. 3, in which a reference voltage level for determining a value of the current data bit D[n] is based on the first previous data bit D[n−1], the DFE 100a according to embodiments of the present disclosure may select the first sampled signal SD1 or the second sampled signal SD2 based on the first previous data bit D[n−1]. That is, there is no need to feed the first previous data bit D[n−1] back to the comparator CMP at a time at which the DFE 100a determines the logic level of the data signal corresponding to the current data bit D[n]. Accordingly, the ISI removing operation may be performed through the DFE 100a of the present disclosure even in a structure where the feedback is impossible within the 1 UI.

Figure 5:
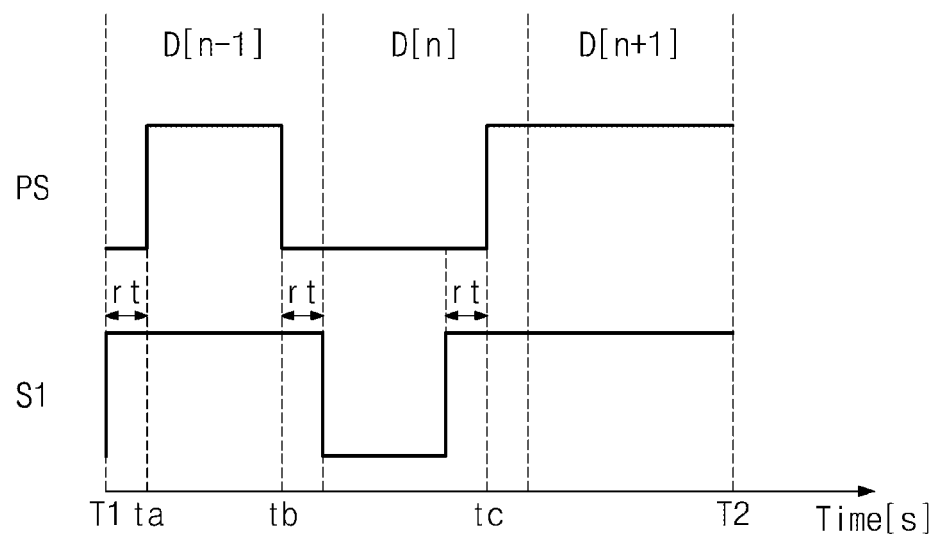
FIG. 5 is a timing diagram illustrating an operation of a first pulse width controller of FIG. 4.

FIG. 5 is a timing diagram illustrating an operation of a first pulse width controller of FIG. 4. Referring to FIGS. 4 and 5, waveforms of the processed signal PS and the first signal S1 between a start time T1 and an end time T2 are illustrated. The processed signal PS may correspond to the processed signal PS of FIG. 4 and the processed signal of FIG. 2. The first signal S1 may correspond to the first signal S1 of FIG. 4.

Referring to the waveform of the processed signal PS, the processed signal PS has the first logic level between the a-th time ta and the b-th time tb and has the first logic level between a c-th time tc and the end time T2.

The first pulse width controller PWC1 may be configured to generate the first signal S1 by increasing the pulse width of the processed signal PS, which corresponds to the first logic level. For example, the first pulse width controller PWC1 may generate the first signal S1 by increasing the pulse width of the processed signal PS, which corresponds to the first logic level between the a-th time ta and the b-th time tb, and increasing the pulse width of the processed signal PS, which corresponds to the first logic level between the c-th time tc and the end time T2.

The first pulse width controller PWC1 may be configured to generate the first signal S1 by increasing the pulse width of the processed signal PS as much as a first reference time interval rt from a voltage level rising time (or a low-to-high transition) and a voltage level falling time (or a high-to-low transition) of the processed signal PS.

For example, referring to the waveform of the first signal S1, the voltage level of the first signal S1 may rise to a high logic level faster than the a-th time ta as much as the first reference time interval rt. The voltage level of the first signal S1 may fall to a low logic level later than the b-th time tb as much as the first reference time interval rt. The voltage level of the first signal S1 may rise to the high logic level faster than the c-th time tc as much as the first reference time interval rt. In some embodiments, the first reference time interval rt may be set by the user.

Because the voltage level rising time of the first signal S1 is faster than that of the processed signal PS as much as the first reference time interval rt and the voltage level falling time of the first signal S1 is later than that of the processed signal PS as much as the first reference time interval rt, the pulse width of the first signal S1 corresponding to the first logic level may be increased as much as the first time interval compared to the pulse width of the processed signal PS corresponding to the first logic level.

As such, the width of the valid data window of the first signal S1 for identifying the first logic level may be greater than the width of the valid data window of the processed signal PS.

Figure 6:
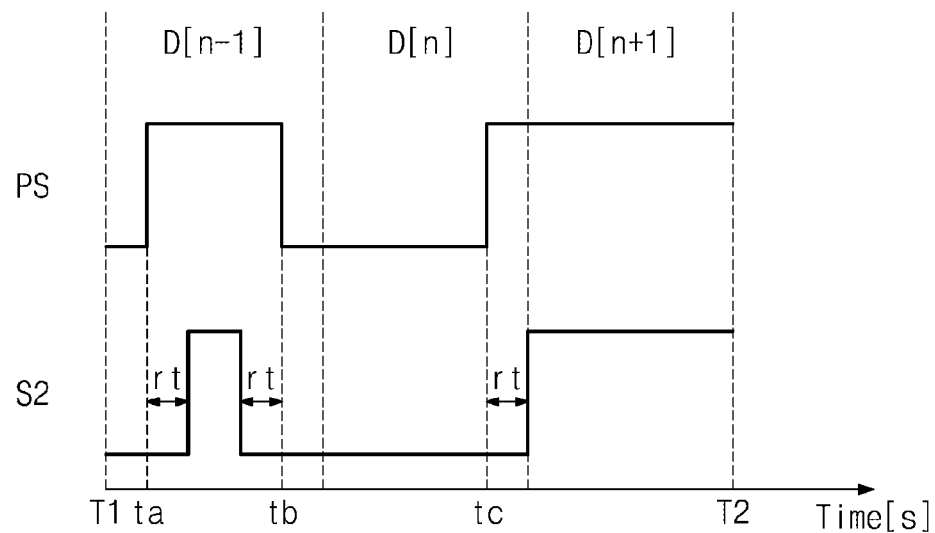
FIG. 6 is a timing diagram illustrating an operation of a second pulse width controller of FIG. 4.

FIG. 6 is a timing diagram illustrating an operation of a second pulse width controller of FIG. 4. Referring to FIGS. 4 and 6, waveforms of the processed signal PS and the second signal S2 between the start time T1 and the end time T2 are illustrated. The processed signal PS may correspond to the processed signal PS of FIG. 4 and the processed signal of FIG. 2. The second signal S2 may correspond to the second signal S2 of FIG. 4.

Referring to the waveform of the processed signal PS, the processed signal PS has the second logic level between the start time T1 and the a-th time ta and has the second logic level between the b-th time tb and the c-th time tc.

The second pulse width controller PWC2 may generate the second signal S2 by increasing the pulse width of the processed signal PS, which corresponds to the second logic level. For example, the second pulse width controller PWC2 may generate the second signal S2 by increasing the pulse width of the processed signal PS, which corresponds to the second logic level between the start time T1 and the a-th time ta, and increasing the pulse width of the processed signal PS, which corresponds to the second logic level between the b-th time tb and the c-th time tc.

The second pulse width controller PWC2 may generate the second signal S2 by increasing the pulse width of the processed signal PS as much as the first reference time interval rt from the voltage level rising time and the voltage level falling time of the processed signal PS. For example, referring to the waveform of the second signal S2, the voltage level of the second signal S2 may rise to the high logic level later than the a-th time ta as much as the first reference time interval rt. The voltage level of the second signal S2 may fall to the low logic level faster than the b-th time tb as much as the first reference time interval rt. The voltage level of the second signal S2 may rise to the high logic level later than the c-th time tc as much as the first reference time interval rt.

Because the voltage level rising time of the second signal S2 is later than that of the processed signal PS as much as the first reference time interval rt and the voltage level falling time of the second signal S2 is faster than that of the processed signal PS as much as the first reference time interval rt, the pulse width of the second signal S2 corresponding to the second logic level may be increased as much as the first time interval compared to the pulse width of the processed signal PS corresponding to the second logic level. In some embodiments, the increment of the pulse width that is controlled by the first pulse width controller PWC1 may be identical to the increment of the pulse width that is controlled by the second pulse width controller PWC2.

As such, the width of the valid data window of the second signal S2 for identifying the second logic level may be greater than the width of the valid data window of the processed signal PS.

Figure 7:
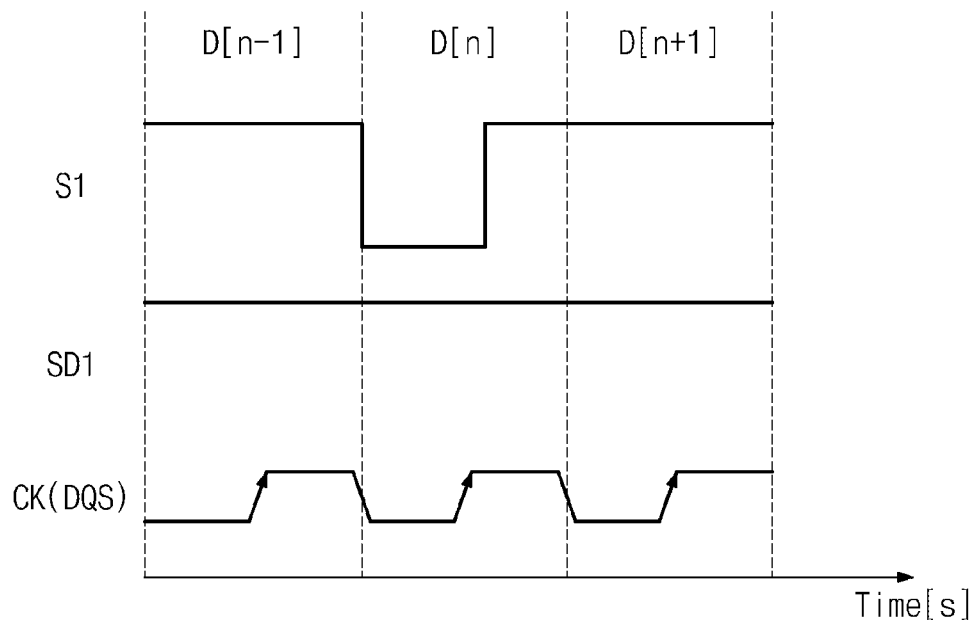
FIG. 7 is a timing diagram illustrating an operation of a first sampler of FIG. 4.

FIG. 7 is a timing diagram illustrating an operation of a first sampler of FIG. 4. Referring to FIGS. 4 and 7, the first signal S1 and the first sampled signal SD1 are illustrated.

The first sampler SMP1 may be configured to sample the first signal S1 based on a clock signal CK and may be configured to generate the first sampled signal SD1. The clock signal CK may refer to the data strobe signal received through the data strobe line DQS.

The first sampler SMP1 may be configured to sample the first signal S1 every point in time of the rising edge of the clock signal CK. For example, referring to the period corresponding to the first previous data bit D[n−1], the logic level of the first signal S1 may be the first logic level at a point in time of the rising edge of the clock signal CK. As such, the first sampler SMP1 may be configured to generate the first sampled signal SD1 having the first value.

Referring to the period corresponding to the current data bit D[n], the logic level of the first signal S1 may be the first logic level at a point in time of the rising edge of the clock signal CK. In the period corresponding to the current data bit D[n], it may be seen as if the logic level of the first signal S1 is the second logic level; however, due to the time delay that the first signal S1 experiences while passing through a device, a medium, etc., the logic level of the first signal S1 may be the first logic level at a point in time of the rising edge of the clock signal CK. As such, the first sampler SMP1 may be configured to generate the first sampled signal SD1 having the first value.

Referring to the period corresponding to the first next data bit D[n+1], the logic level of the first signal S1 may be the first logic level at a point in time of the rising edge of the clock signal CK. As such, the first sampler SMP1 may be configured to generate the first sampled signal SD1 having the first value.

Figure 8:
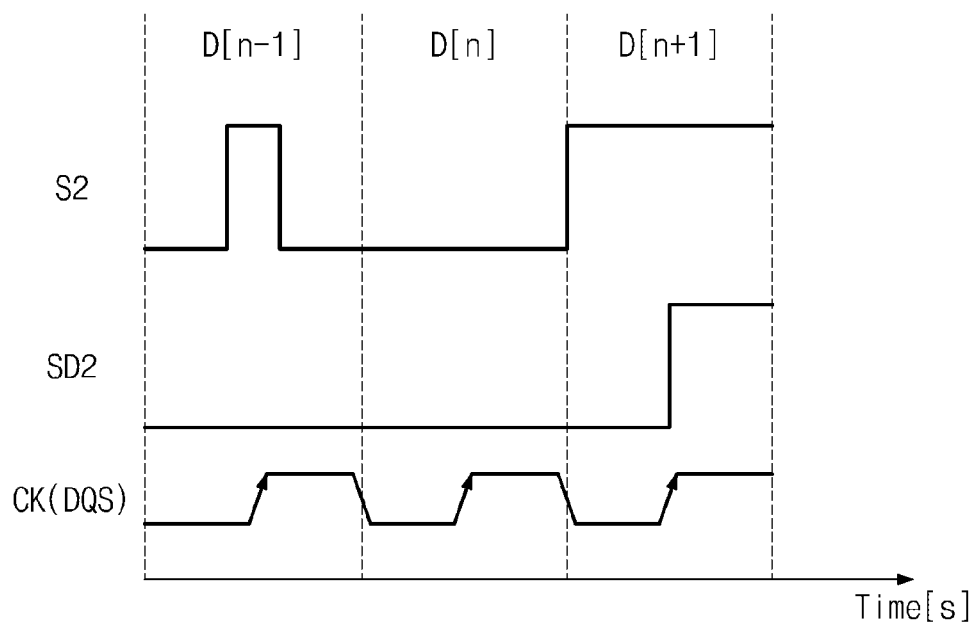
FIG. 8 is a timing diagram illustrating an operation of a second sampler of FIG. 4.

FIG. 8 is a timing diagram illustrating an operation of a second sampler of FIG. 4. Referring to FIGS. 4 and 8, the second signal S2 and the second sampled signal SD2 are illustrated.

The second sampler SMP2 may be configured to sample the second signal S2 based on the clock signal CK and may be configured to generate the second sampled signal SD2. The clock signal CK may refer to the data strobe signal received through the data strobe line DQS.

The second sampler SMP2 may be configured to sample the second signal S2 every point in time of the rising edge of the clock signal CK. For example, referring to the period corresponding to the first previous data bit D[n−1], the logic level of the second signal S2 may be the second logic level at a point in time of the rising edge of the clock signal CK. In the period corresponding to the first previous data bit D[n−1], it may be seen as if the logic level of the second signal S2 is the first logic level; however, due to the time delay that the second signal S2 experiences while passing through a device, a medium, etc., the logic level of the second signal S2 may be the second logic level at a point in time of the rising edge of the clock signal CK. As such, the second sampler SMP2 may be configured to generate the second sampled signal SD2 having the second value.

Referring to the period corresponding to the current data bit D[n], the logic level of the second signal S2 may be the second logic level at a point in time of the rising edge of the clock signal CK. As such, the second sampler SMP2 may be configured to generate the second sampled signal SD2 having the second value. Referring to the period corresponding to the first next data bit D[n+1], the logic level of the second signal S2 may be the first logic level at a point in time of the rising edge of the clock signal CK. As such, the second sampler SMP2 may be configured to generate the second sampled signal SD2 having the first value.

Examples where the first sampler SMP1 and the second sampler SMP2 are implemented with a single data rate (SDR) structure are illustrated in FIGS. 7 and 8, but embodiments of the present disclosure is not limited thereto. For example, the first sampler SMP1 and the second sampler SMP2 may be implemented with a double data rate (DDR) structure.

Figure 9:
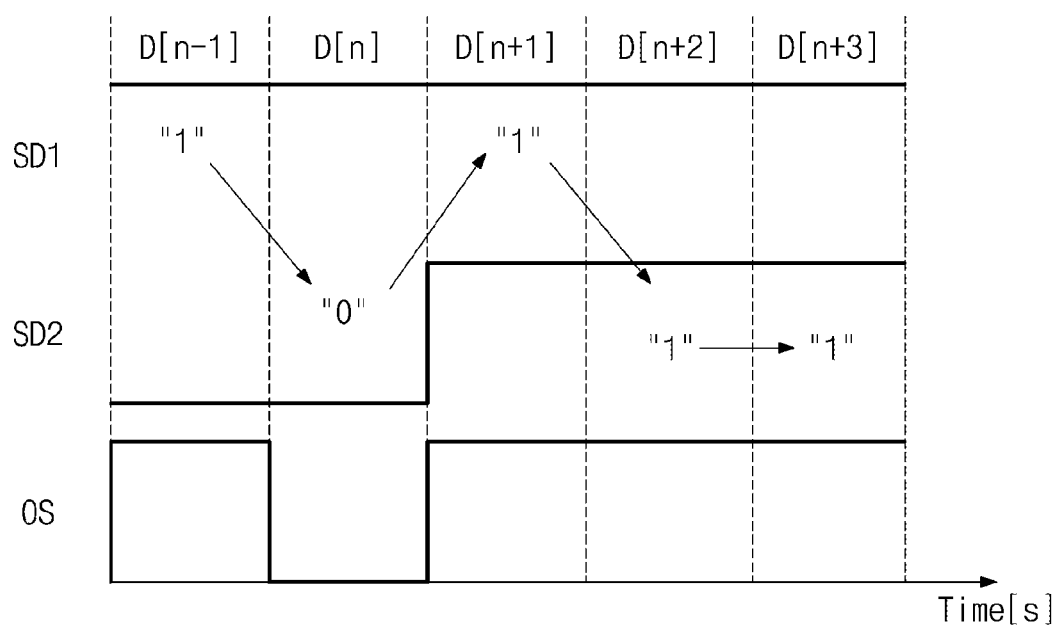
FIG. 9 is a timing diagram illustrating an operation of a first multiplexer of FIG. 4.

FIG. 9 is a timing diagram illustrating an operation of a first multiplexer of FIG. 4. Referring to FIGS. 7, 8, and 9, the first sampled signal SD1, the second sampled signal SD2, and the output signal OS are illustrated. The plurality of data bits D[n−1], D[n], and D[n+1] of the first sampled signal SD1 may correspond to the plurality of data bits D[n−1], D[n], and D[n+1] of FIG. 7. The plurality of data bits D[n−1], D[n], and D[n+1] of the second sampled signal SD2 may correspond to the plurality of data bits D[n−1], D[n], and D[n+1] of FIG. 8. The output signal OS may correspond to the output signal OS of FIG. 4.

The first multiplexer MUX1 may be configured to output the first sampled signal SD1 or the second sampled signal SD2 based on a data bit whose ISI removing operation is completed before the unit time period. For example, when the value of the first previous data bit D[n−1] is "1," in the time interval corresponding to the current data bit D[n], the first multiplexer MUX1 may output the second sampled signal SD2. When the value of the current data bit D[n] is "0," in the time interval corresponding to the first next data bit D[n+1], the first multiplexer MUX1 may output the first sampled signal SD1. When the value of the first next data bit D[n+1] is "1," in the time interval corresponding to a second next data bit D[n+2], the first multiplexer MUX1 may output the second sampled signal SD2. When the value of the second next data bit D[n+2] is "1," in the time interval corresponding to a third next data bit D[n+3], the first multiplexer MUX1 may output the second sampled signal SD2.

As described above, the output signal OS may include the second sampled signal SD2 having the second value in the time interval corresponding to the current data bit D[n], the first sampled signal SD1 having the first value in the time interval corresponding to the first next data bit D[n+1], the second sampled signal SD2 having the first value in the time interval corresponding to the second next data bit D[n+2], and the second sampled signal SD2 having the first value in the time interval corresponding to the third next data bit D[n+3].

The DFE 100a may be configured to generate the output signal OS similar to the raw signal illustrated in FIG. 2, by removing the ISI of the processed signal. As such, the effective margin for identifying a data bit may be sufficiently secured at the receive stage of the memory device 12. Accordingly, the memory device 12 that supports a high-speed interface may receive and process data from the memory controller 11 with fewer errors, and thus, the reliability of the memory device 12 is improved.

Figure 10:
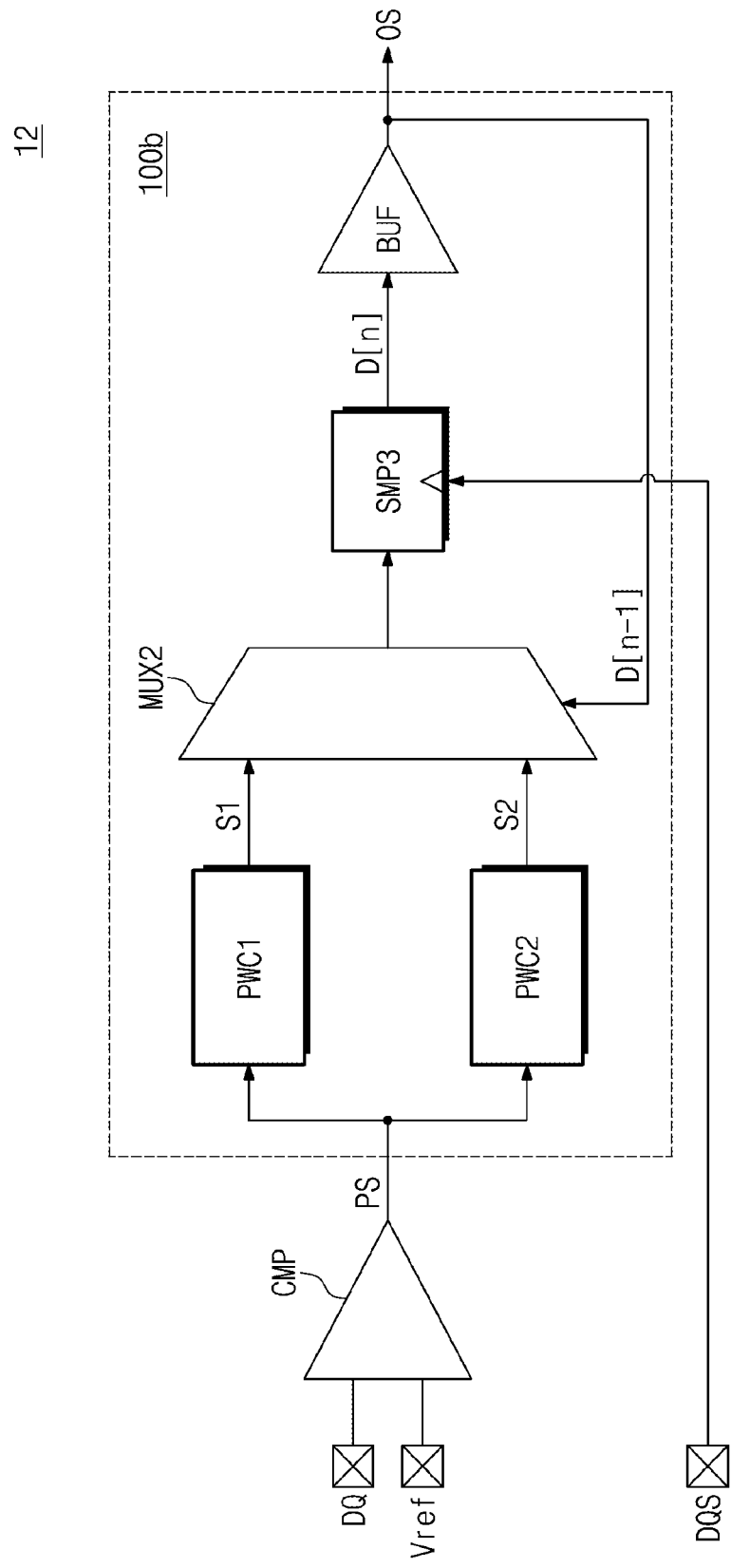
FIG. 10 is a block diagram illustrating a memory device according to an embodiment of the present disclosure.

FIG. 10 is a block diagram illustrating a memory device according to an embodiment of the present disclosure. Referring to FIGS. 1 and 10, the memory device 12 may include the comparator CMP and a DFE 100b. DFE 100b can be implemented as an equalizer. For convenience of description and for brevity of illustrating, components of the memory device 12 are conceptually illustrated, and some unnecessary components are omitted. The DFE 100b may correspond to the DFE 100 of FIG. 1 and the DFE 100a of FIG. 4. The comparator CMP, the first pulse width controller PWC1, and the second pulse width controller PWC2 of FIG. 10 may respectively correspond to the comparator CMP, the first pulse width controller PWC1, and the second pulse width controller PWC2 of FIG. 4.

The comparator CMP may be configured to generate the processed signal PS based on the reference voltage Vref by comparing the data signal received from the memory controller 11 with the reference voltage Vref.

Below, a structure of the DFE 100b will be described. The DFE 100b may be configured to perform the ISI removing operation on the processed signal PS corresponding to the current data bit D[n] and may output the output signal OS. The DFE 100b may include the first pulse width controller PWC1, the second pulse width controller PWC2, a third sampler SMP3, a second multiplexer MUX2, and a buffer BUF.

The first pulse width controller PWC1 may generate the first signal S1 by increasing the pulse width of the processed signal PS, which corresponds to the first logic level. The second pulse width controller PWC2 may generate the second signal S2 by increasing the pulse width of the processed signal PS, which corresponds to the second logic level.

The second multiplexer MUX2 may output one of the first signal S1 and the second signal S2 based on a value of the first previous data bit D[n−1]. In some embodiments, when the first previous data bit D[n−1] has the first value, the second multiplexer MUX2 may output the second signal S2. For example, the first value may be "1." When the first previous data bit D[n−1] has the second value, the second multiplexer MUX2 may output the first signal S1. For example, the second value may be "0." This will be described in detail with reference to FIG. 11.

The third sampler SMP3 may be configured to sample the signal output from the second multiplexer MUX2 based on the data strobe signal. When the second multiplexer MUX2 outputs the first signal S1, the third sampler SMP3 may sample the first signal S1 and may output the current data bit D[n]. When the second multiplexer MUX2 outputs the second signal S2, the third sampler SMP3 may sample the second signal S2 and may output the current data bit D[n].

The buffer BUF may be configured to adjust the time to output the signal received from the third sampler SMP3. When the DFE 100b processes the data signal corresponding to the current data bit D[n], the buffer BUF may output the first previous data bit D[n−1] whose ISI removing operation is completed before the unit time period, to the second multiplexer MUX2.

Figure 11:
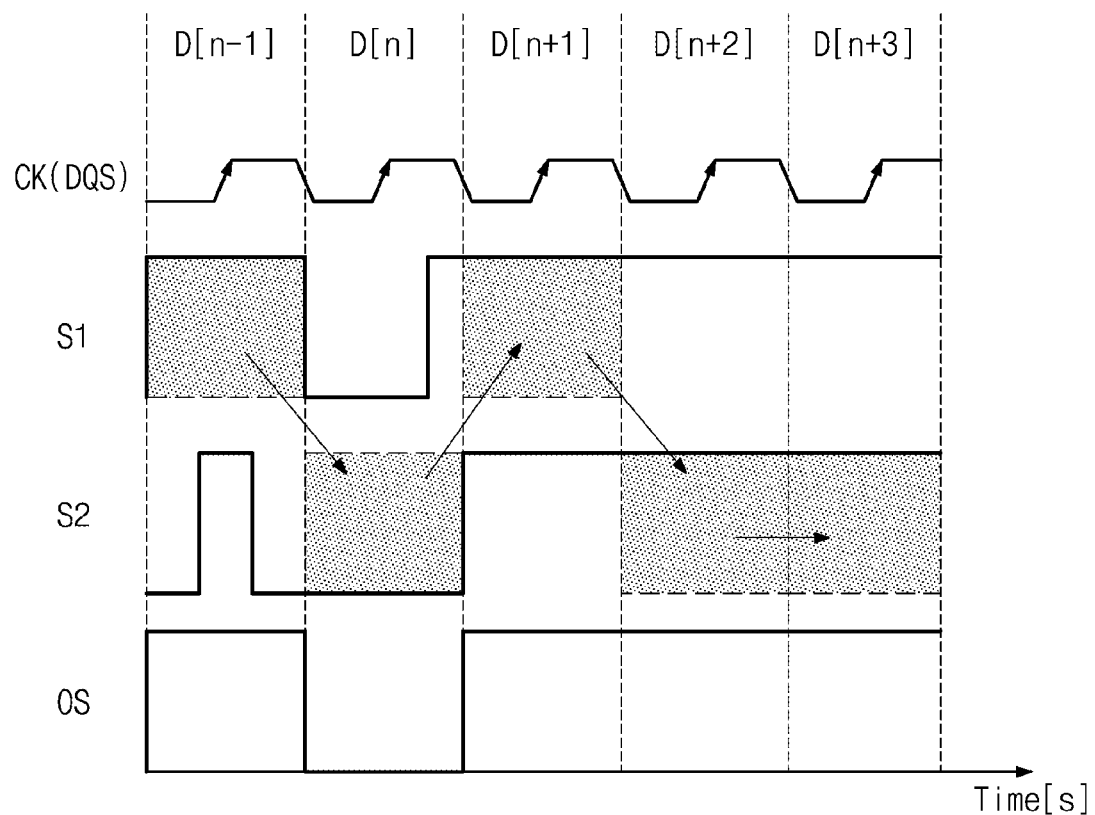
FIG. 11 is a timing diagram illustrating an operation of a second multiplexer of FIG. 10.

FIG. 11 is a timing diagram illustrating an operation of a second multiplexer of FIG. 10. Referring to FIGS. 10 and 11, the first signal S1, the second signal S2, and the output signal OS are illustrated. The first signal S1, the second signal S2, and the output signal OS may respectively correspond to the first signal S1, the second signal S2, and the output signal OS of FIG. 10.

The second multiplexer MUX2 may be configured to output the first signal S1 or the second signal S2 based on a data bit whose ISI removing operation is completed before the unit time period. For example, when the value of the first previous data bit D[n−1] is "1," in the time interval corresponding to the current data bit D[n], the second multiplexer MUX2 may output the second signal S2. When the value of the current data bit D[n] is "0," in the time interval corresponding to the first next data bit D[n+1], the second multiplexer MUX2 may output the first signal S1. When the value of the first next data bit D[n+1] is "1," in the time interval corresponding to the second next data bit D[n+2], the second multiplexer MUX2 may output the second signal S2. When the value of the second next data bit D[n+2] is "1," in the time interval corresponding to the third next data bit D[n+3], the second multiplexer MUX2 may output the second signal S2.

Referring to the output signal OS of the DFE 100b, there are illustrated the first previous data bit D[n−1] output as a result of sampling the first signal S1 at a point in time of the rising edge of the clock signal CK, the current data bit D[n] output as a result of sampling the second signal S2 at a point in time of the rising edge of the clock signal CK, the first next data bit D[n+1] output as a result of sampling the first signal S1 at a point in time of the rising edge of the clock signal CK, the second next data bit D[n+2] output as a result of sampling the second signal S2 at a point in time of the rising edge of the clock signal CK, and the third next data bit D[n+3] output as a result of sampling the second signal S2 at a point in time of the rising edge of the clock signal CK.

Comparing the output signal OS of the DFE 100b and the processed signal of FIG. 2, the width of the valid data window of the output signal OS that the DFE 100b outputs may become greater. That is, the DFE 100b may be configured to generate the output signal OS similar to the raw signal illustrated in FIG. 2, by removing the ISI of the processed signal. As such, the effective margin for identifying a data bit may be sufficiently secured at the receive stage of the memory device 12.

Figure 12:
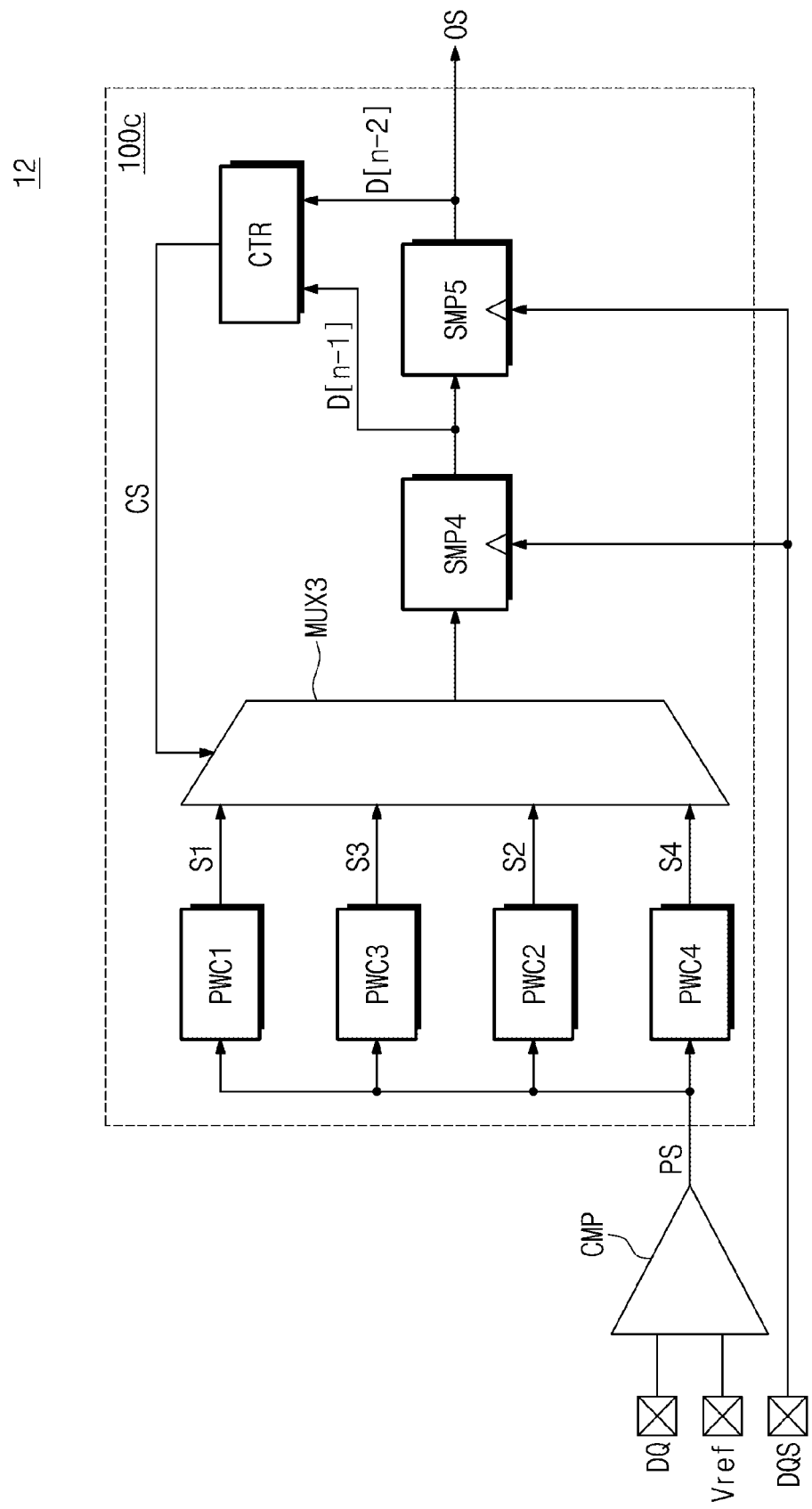
FIG. 12 is a block diagram illustrating a memory device according to an embodiment of the present disclosure.

FIG. 12 is a block diagram illustrating a memory device according to an embodiment of the present disclosure. Referring to FIGS. 1 and 12, the memory device 12 may include the comparator CMP and a DFE 100c. DFE 100c can be implemented as an equalizer. For convenience of description and for brevity of illustration, components of the memory device 12 are conceptually illustrated, and some unnecessary components are omitted. The DFE 100c may correspond to the DFE 100 of FIG. 1 and the DFE 100a of FIG. 4. The comparator CMP, the first pulse width controller PWC1, and the second pulse width controller PWC2 of FIG. 12 may respectively correspond to the comparator CMP, the first pulse width controller PWC1, and the second pulse width controller PWC2 of FIG. 4.

The comparator CMP may be configured to generate the processed signal PS based on the reference voltage Vref by comparing the data signal received from the memory controller 11 with the reference voltage Vref. An example where the DFE is implemented with the SDR structure is illustrated in FIG. 12, but embodiments of the present disclosure are not limited thereto. For example, the DFE may be implemented with the DDR structure.

Below, a structure of the DFE 100c will be described. The DFE 100c may be configured to perform the ISI removing operation on the processed signal PS corresponding to the current data bit D[n] and may output the output signal OS. The DFE 100c may include the first pulse width controller PWC1, the second pulse width controller PWC2, a third pulse width controller PWC3, a fourth pulse width controller PWC4, a third multiplexer MUX3, a fourth sampler SMP4, a fifth sampler SMP5, and a control circuit CTR.

Unlike the DFE 100b of FIG. 10, the DFE 100c may be configured to generate the current data bit D[n] based on the first previous data bit D[n−1] and a second previous data bit D[n−2]. That is, the DFE 100c may be implemented with 2-tap DFE. The data signal corresponding to the second previous data bit D[n−2] may be received from the memory controller 11 before the unit time period compared to the data bit corresponding to the first previous data bit D[n−1].

The first pulse width controller PWC1 may be configured to generate the first signal S1 by increasing the pulse width of the processed signal PS, which corresponds to the first logic level, as much as the first time interval. The second pulse width controller PWC2 may be configured to generate the second signal S2 by increasing the pulse width of the processed signal PS, which corresponds to the second logic level, as much as the first time interval.

The third pulse width controller PWC3 may be configured to generate a third signal S3 by increasing the pulse width of the processed signal PS, which corresponds to the first logic level, as much as a second time interval. This will be described in detail with reference to FIG. 13.

The fourth pulse width controller PWC4 may be configured to generate a fourth signal S4 by increasing the pulse width of the processed signal PS, which corresponds to the second logic level, as much as the second time interval. This will be described in detail with reference to FIG. 14.

The third multiplexer MUX3 may be configured to output one of the first to fourth signals S1 to S4 based on a control signal CS. In some embodiments, when the control signal CS indicates that the second previous data bit D[n−2] and the first previous data bit D[n−1] have a first data pattern, the third multiplexer MUX3 may output the third signal S3. For example, the first data pattern may be "00" (i.e., D[n−2]=0 and D[n−1]=0).

When the control signal CS indicates that the second previous data bit D[n−2] and the first previous data bit D[n−1] have a second data pattern, the third multiplexer MUX3 may output the first signal S1. For example, the second data pattern may be "10" (i.e., D[n−2]=1 and D[n−1]=0).

When the control signal CS indicates that the second previous data bit D[n−2] and the first previous data bit D[n−1] have a third data pattern, the third multiplexer MUX3 may output the second signal S2. For example, the third data pattern may be "01" (i.e., D[n−2]=0 and D[n−1]=1).

When the control signal CS indicates that the second previous data bit D[n−2] and the first previous data bit D[n−1] have a fourth data pattern, the third multiplexer MUX3 may output the fourth signal S4. For example, the fourth data pattern may be "11" (i.e., D[n−2]=1 and D[n−1]=1).

As the third multiplexer MUX3 outputs one of the first to fourth signals S1 to S4 based on the data pattern of the second previous data bit D[n−2] and the first previous data bit D[n−1], the ISI may be accurately compensated for.

For example, assuming that the first previous data bit D[n−1] has the value of "1," the distortion that occurs in the current data bit D[n] when the value of the second previous data bit D[n−2] is "1" may be different from the distortion that occurs in the current data bit D[n] when the value of the second previous data bit D[n−2] is "0." In other words, compared with the case where the second previous data bit D[n−2] has the value of "0", there is a need to compensate for the logic low level of the current data bit D[n] more greatly when the second previous data bit D[n−2] has the value of "1."

As described above, when the control signal CS indicates that the second previous data bit D[n−2] and the first previous data bit D[n−1] have the second data pattern, the third multiplexer MUX3 may output the first signal S1 in which the pulse width corresponding to the logic low level is increased as much as the first time interval. When the control signal CS indicates that the second previous data bit D[n−2] and the first previous data bit D[n−1] have the fourth data pattern, the third multiplexer MUX3 may output the fourth signal S4 in which the pulse width corresponding to the logic low level is increased as much as the second time interval. That is, compared with the case where the second previous data bit D[n−2] has the value of "0," the DFE 100c may compensate for the logic low level of the current data bit D[n] more greatly when the second previous data bit D[n−2] has the value of "1." As such, the ISI removing operation may be more accurately performed.

The fourth sampler SMP4 and the fifth sampler SMP5 may sample the signal output from the third multiplexer MUX3 based on the data strobe signal. The fifth sampler SMP5 may sample the signal output before the unit time period compared to the fourth sampler SMP4.

For example, when the third multiplexer MUX3 outputs the first signal S1, the fifth sampler SMP5 may sample the first signal S1 to output the second previous data bit D[n−2], and the fourth sampler SMP4 may sample the first signal S1 to output the first previous data bit D[n−1].

The control circuit CTR may be configured to generate the control signal CS based on bits output from the fourth sampler SMP4 and the fifth sampler SMP5. In some embodiments, the control signal CS may refer to a signal including a first bit and a second bit.

For example, when the second previous data bit D[n−2] and the first previous data bit D[n−1] have the first data pattern, a value of the first bit may be "1," and a value of the second bit may be "0." When the second previous data bit D[n−2] and the first previous data bit D[n−1] have the second data pattern, a value of the first bit may be "0," and a value of the second bit may be "0." When the second previous data bit D[n−2] and the first previous data bit D[n−1] have the third data pattern, a value of the first bit may be "0," and a value of the second bit may be "1." When the second previous data bit D[n−2] and the first previous data bit D[n−1] have the fourth data pattern, a value of the first bit may be "1," and a value of the second bit may be "1."

Figure 13:
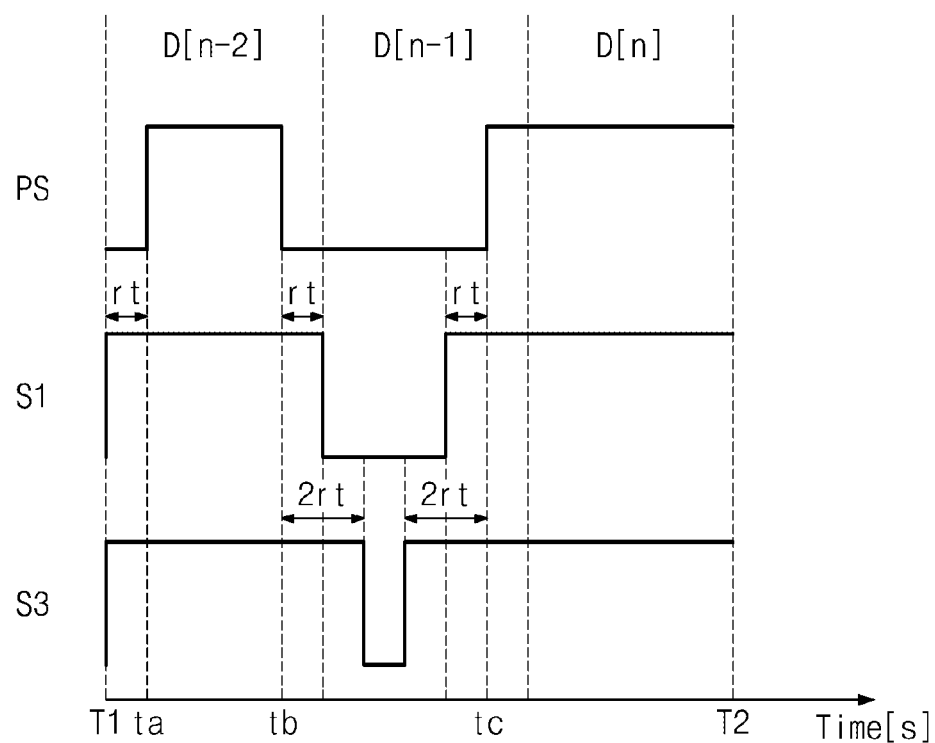
FIG. 13 is a timing diagram illustrating an operation of a first pulse width controller and a third pulse width controller of FIG. 12.

FIG. 13 is a timing diagram illustrating an operation of a first pulse width controller and a third pulse width controller of FIG. 12. Referring to FIGS. 12 and 13, waveforms of the processed signal PS, the first signal S1, and the third signal S3 between the start time T1 and the end time T2 are illustrated. The processed signal PS may correspond to the output processed PS of FIG. 5. The first signal S1 may correspond to the first signal S1 of FIG. 5. The DFE 100c may generate the current data bit D[n] based on the first previous data bit D[n−1] and the second previous data bit D[n−2].

Referring to the waveform of the processed signal PS, the processed signal PS has the first logic level between the a-th time ta and the b-th time tb and has the first logic level between the c-th time tc and the end time T2.

The first pulse width controller PWC1 may be configured to generate the first signal S1 by increasing the pulse width of the processed signal PS, which corresponds to the first logic level, as much as the first time interval. In detail, the first pulse width controller PWC1 may generate the first signal S1 by increasing the pulse width of the processed signal PS as much as the first reference time interval rt from the voltage level rising time and the voltage level falling time of the processed signal PS.

For example, referring to the waveform of the first signal S1, the voltage level of the first signal S1 may rise to the high logic level faster than the a-th time ta as much as the first reference time interval rt. The voltage level of the first signal S1 may fall the low logic level later than the b-th time tb as much as the first reference time interval rt. The voltage level of the first signal S1 may rise to the high logic level faster than the c-th time tc as much as the first reference time interval rt.

The third pulse width controller PWC3 may be configured to generate the third signal S3 by increasing the pulse width of the processed signal PS, which corresponds to the first logic level, as much as the second time interval. In detail, the third pulse width controller PWC3 may generate the third signal S3 by increasing the pulse width of the processed signal PS as much as a second reference time interval 2rt from the voltage level rising time and the voltage level falling time of the processed signal PS.

For example, referring to the waveform of the third signal S3, the voltage level of the third signal S3 may fall to the low logic level later than the b-th time tb as much as the second reference time interval 2rt. The voltage level of the third signal S3 may rise to the high logic level faster than the c-th time tc as much as the second reference time interval 2rt.

In some embodiments, the second reference time interval 2rt may be set by the user. The second reference time interval 2rt may be longer than the first reference time interval rt. The second reference time interval 2rt may be two times the first reference time interval rt. That is, the third pulse width controller PWC3 may increase the pulse width corresponding to the first logic level to be greater than the first pulse width controller PWC1.

Because the voltage level rising time of the third signal S3 is faster than that of the processed signal PS as much as the second reference time interval 2rt and the voltage level falling time of the third signal S3 is later than that of the processed signal PS as much as the second reference time interval 2rt, the pulse width of the third signal S3 corresponding to the first logic level may be increased as much as the second time interval compared to the pulse width of the processed signal PS corresponding to the first logic level.

Figure 14:
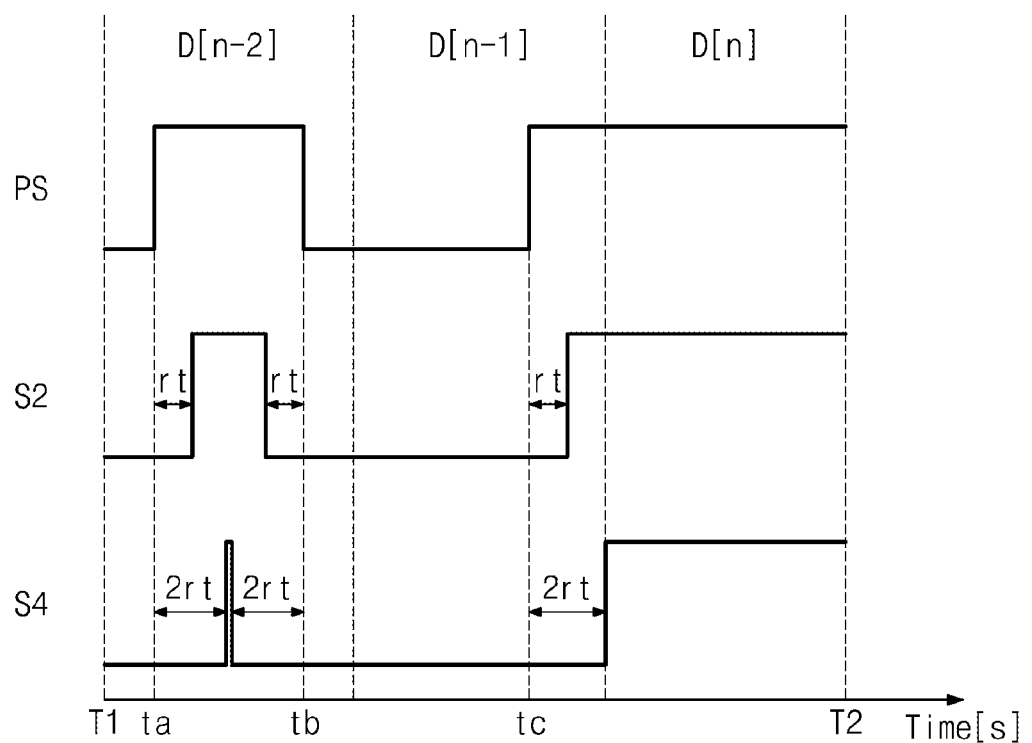
FIG. 14 is a timing diagram illustrating an operation of a second pulse width controller and a fourth pulse width controller of FIG. 12.

FIG. 14 is a timing diagram illustrating an operation of a second pulse width controller and a fourth pulse width controller of FIG. 12. Referring to FIGS. 12 and 14, waveforms of the processed signal PS, the second signal S2, and the fourth signal S4 between the start time T1 and the end time T2 are illustrated. The processed signal PS may correspond to the processed signal PS of FIG. 6. The second signal S2 may correspond to the second signal S2 of FIG. 6. The DFE 100c may generate the current data bit D[n] based on the first previous data bit D[n−1] and the second previous data bit D[n−2].

Referring to the waveform of the processed signal PS, the processed signal PS has the second logic level between the start time T1 and the a-th time ta and has the second logic level between the b-th time tb and the c-th time tc.

The second pulse width controller PWC2 may be configured to generate the second signal S2 by increasing the pulse width of the processed signal PS, which corresponds to the second logic level. In detail, the second pulse width controller PWC2 may generate the second signal S2 by increasing the pulse width of the processed signal PS as much as the first reference time interval rt from the voltage level rising time and the voltage level falling time of the processed signal PS.

For example, referring to the waveform of the second signal S2, the voltage level of the second signal S2 may rise to the high logic level later than the a-th time ta as much as the first reference time interval rt. The voltage level of the second signal S2 may fall to the low logic level faster than the b-th time tb as much as the first reference time interval rt. The voltage level of the second signal S2 may rise to the high logic level later than the c-th time tc as much as the first reference time interval rt.

The fourth pulse width controller PWC4 may be configured to generate the fourth signal S4 by increasing the pulse width of the processed signal PS, which corresponds to the second logic level, as much as the second time interval. In detail, the fourth pulse width controller PWC4 may generate the fourth signal S4 by increasing the pulse width of the processed signal PS as much as the second reference time interval 2rt from the voltage level rising time and the voltage level falling time of the processed signal PS.

For example, referring to the waveform of the fourth signal S4, the voltage level of the fourth signal S4 may rise to the high logic level later than the a-th time ta as much as the second reference time interval 2rt. The voltage level of the fourth signal S4 may fall to the low logic level faster than the b-th time tb as much as the second reference time interval 2rt. The voltage level of the fourth signal S4 may rise to the high logic level later than the c-th time tc as much as the second reference time interval 2rt.

In some embodiments, the second reference time interval 2rt may be set by the user. The second reference time interval 2rt may be longer than the first reference time interval rt. The second reference time interval 2rt may be two times the first reference time interval rt. That is, the fourth pulse width controller PWC4 may increase the pulse width corresponding to the second logic level to be greater than the second pulse width controller PWC2.

Because the voltage level rising time of the fourth signal S4 is later than that of the processed signal PS as much as the second reference time interval 2rt and the voltage level falling time of the fourth signal S4 is faster than that of the processed signal PS as much as the second reference time interval 2rt, the pulse width of the fourth signal S4 corresponding to the second logic level may be increased as much as the second time interval compared to the pulse width of the processed signal PS corresponding to the second logic level.

Figure 15:
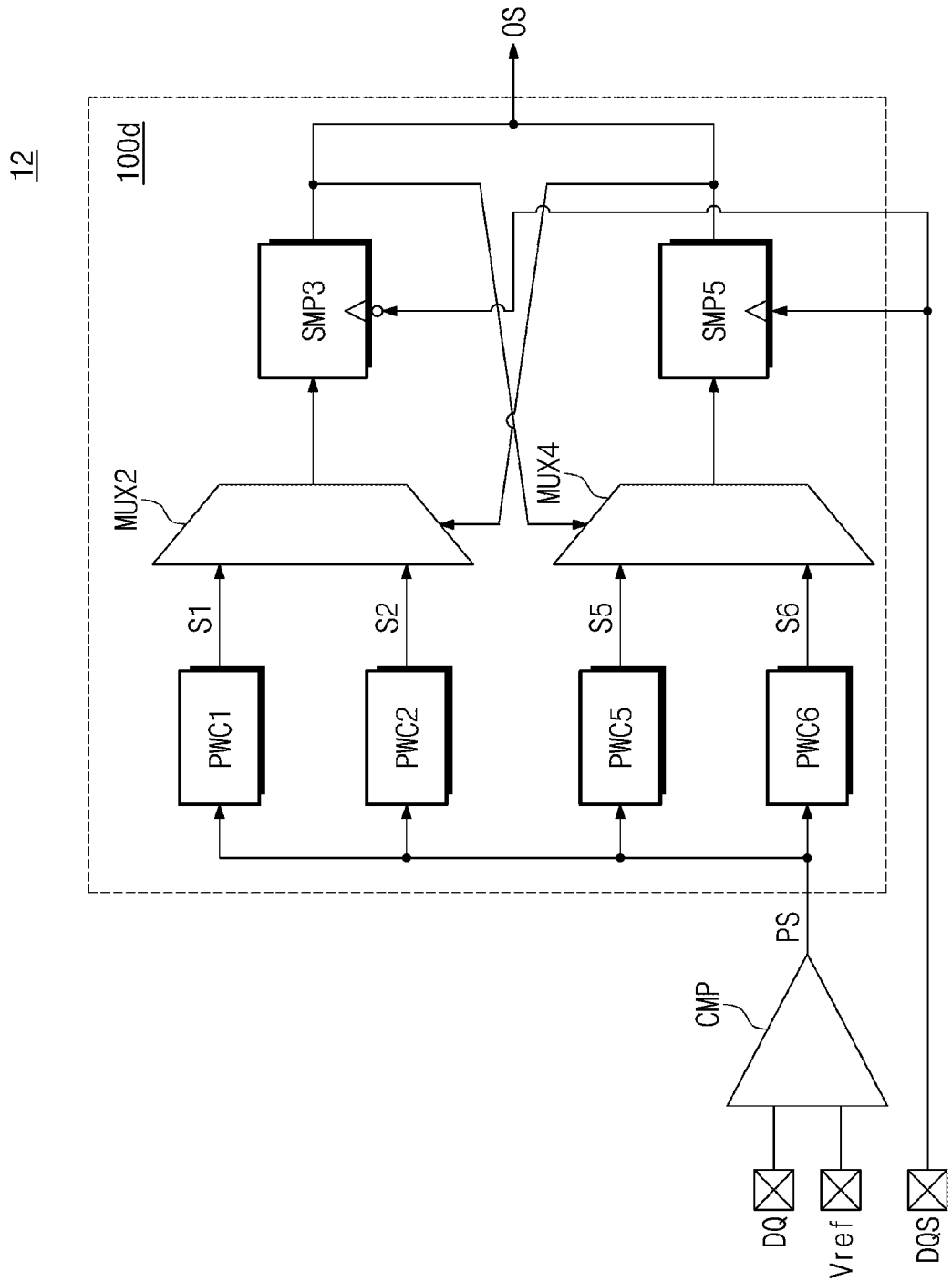
FIG. 15 is a block diagram illustrating a memory device according to an embodiment of the present disclosure.

FIG. 15 is a block diagram illustrating a memory device according to an embodiment of the present disclosure in detail. Referring to FIGS. 1 and 15, the memory device 12 may include the comparator CMP and a DFE 100d. DFE 100d can be implemented as an equalizer. For convenience of description and for brevity of illustration, components of the memory device 12 are conceptually illustrated, and some unnecessary components are omitted.

The DFE 100d may correspond to the DFE 100 of FIG. 1 and the DFE 100a of FIG. 4. The comparator CMP, the first pulse width controller PWC1, the second pulse width controller PWC2, the third sampler SMP3, and the second multiplexer MUX2 of FIG. 15 may respectively correspond to the comparator CMP, the first pulse width controller PWC1, the second pulse width controller PWC2, the third sampler SMP3, and the second multiplexer MUX2 of FIG. 10.

The comparator CMP may be configured to generate the processed signal PS based on the reference voltage Vref by comparing the data signal received from the memory controller 11 with the reference voltage Vref.

Below, a structure of the DFE 100d will be described. The DFE 100d may be configured to perform the ISI removing operation on the processed signal PS corresponding to the current data bit D[n] and may output the output signal OS. The DFE 100d may include the first pulse width controller PWC1, the second pulse width controller PWC2, a fifth pulse width controller PWC5, a sixth pulse width controller PWC6, the second multiplexer MUX2, a fourth multiplexer MUX4, the third sampler SMP3, and the fifth sampler SMP5.

Also, the DFE 100d may be configured to operate based on the double data rate (DDR). The DFE 100a of FIG. 4 may receive one data bit every point in time of the rising edge of the data strobe signal; in contrast, the DFE 100d of FIG. 15 may receive one data bit every point in time of the rising edge of the clock signal CK (or the data strobe signal) and may receive one data bit every point in time of the falling edge of the clock signal CK (or the data strobe signal).

The first pulse width controller PWC1 may be configured generate the first signal S1 by increasing the pulse width of the processed signal PS, which corresponds to the first logic level, as much as the first time interval. The second pulse width controller PWC2 may be configured to generate the second signal S2 by increasing the pulse width of the processed signal PS, which corresponds to the second logic level, as much as the first time interval.

The fifth pulse width controller PWC5 may be configured to generate a fifth signal S5 by increasing the pulse width of the processed signal PS, which corresponds to the first logic level, as much as the first time interval. The fifth pulse width controller PWC5 may operate to be identical to the first pulse width controller PWC1.

The sixth pulse width controller PWC6 may be configured to generate a sixth signal S6 by increasing the pulse width of the processed signal PS, which corresponds to the second logic level, as much as the first time interval. The sixth pulse width controller PWC6 may operate to be identical to the second pulse width controller PWC2.

The second multiplexer MUX2 may be configured to output the first signal S1 or the second signal S2 based on an output of the fifth sampler SMP5. In some embodiments, when the bit output from the fifth sampler SMP5 has the first value, the second multiplexer MUX2 may output the second signal S2. For example, the first value may be "1." When the bit output from the fifth sampler SMP5 has the second value, the second multiplexer MUX2 may output the first signal S1. For example, the second value may be "0."

The fourth multiplexer MUX4 may be configured to output the fifth signal S5 or the sixth signal S6 based on an output of the third sampler SMP3. In some embodiments, when the bit output from the third sampler SMP3 has the first value, the fourth multiplexer MUX4 may output the fifth signal S5. For example, the first value may be "1." When the bit output from the third sampler SMP3 has the second value, the fourth multiplexer MUX4 may output the sixth signal S6. For example, the second value may be "0." Operations of the second and fourth multiplexers MUX2 and MUX4 will be described in detail with reference to FIG. 16.

The third sampler SMP3 may be configured to sample the first signal S1 or the second signal S2 based on a point in time of the falling edge of the data strobe signal. The fourth multiplexer MUX4 may be configured to output the fifth signal S5 or the sixth signal S6 based on a signal sampled at the point in time of the falling edge of the data strobe signal. As such, odd data may be selected based on a result of sampling even data.

The fifth sampler SMP5 may be configured to sample the signal output from the fourth multiplexer MUX4 based on the data strobe signal. That is, the fifth sampler SMP5 may be configured to sample the fifth signal S5 or the sixth signal S6 based on a point in time of the rising edge of the data strobe signal. The second multiplexer MUX2 may be configured to output the first signal S1 or the second signal S2 based on a signal sampled at the point in time of the rising edge of the data strobe signal. As such, even data may be selected based on a result of sampling odd data.

Figure 16:
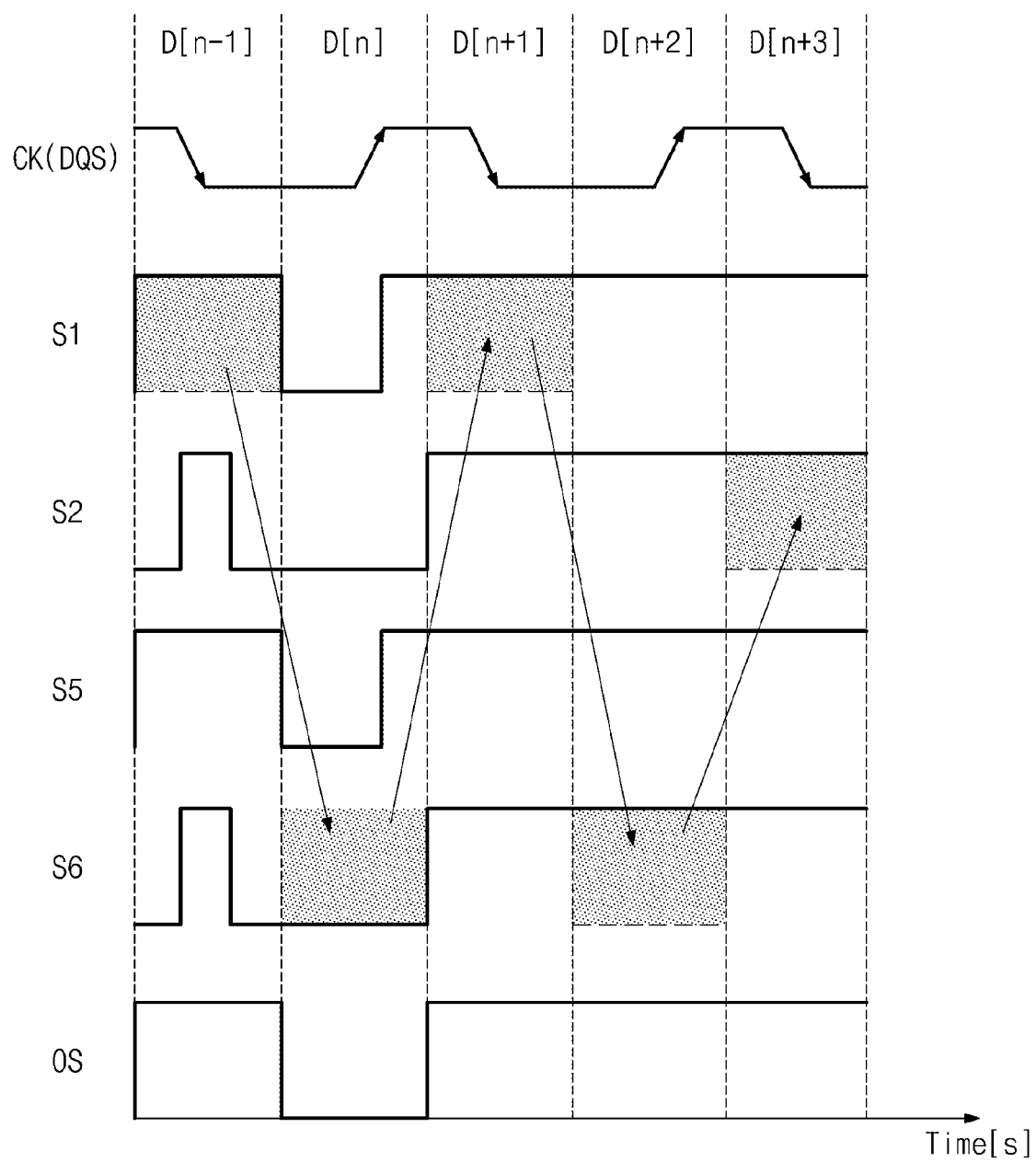
FIG. 16 is a timing diagram illustrating an operation of a second multiplexer and a fourth multiplexer of FIG. 15.

FIG. 16 is a timing diagram illustrating an operation of a second multiplexer and a fourth multiplexer of FIG. 15. Referring to FIGS. 15 and 16, the first signal S1, the second signal S2, the fifth signal S5, the sixth signal S6, and the output signal OS are illustrated. The first signal S1, the second signal S2, and the output signal OS may respectively correspond to the first signal S1, the second signal S2, and the output signal OS of FIG. 11.

As the fifth pulse width controller PWC5 operates to be identical to the first pulse width controller PWC1, the fifth signal S5 may have the same waveform as the first signal S1. As the sixth pulse width controller PWC6 operates to be identical to the second pulse width controller PWC2, the sixth signal S6 may have the same waveform as the second signal S2. Below, the operation of the fourth multiplexer MUX4 that outputs a signal to be sampled based on the rising edge of the clock signal CK by using a result sampled based on the falling edge of the clock signal CK and the operation of the second multiplexer MUX2 that outputs a signal to be sampled based on the falling edge of the clock signal CK by using a result sampled based on the rising edge of the clock signal CK will be described.

In the time interval corresponding to the first previous data bit D[n−1], the third sampler SMP3 may sample the first signal S1 at a point in time of the falling edge of the clock signal CK and may output the first previous data bit D[n−1].

In the time interval corresponding to the current data bit D[n], the fourth multiplexer MUX4 may select the sixth signal S6 among the fifth signal S5 and the sixth signal S6 based on that a value of the first previous data bit D[n−1] is "1." That is, when the value of the result sampled based on the falling edge of the clock signal CK is "1," the fourth multiplexer MUX4 may output the sixth signal S6 as a signal to be sampled based on the rising edge of the clock signal CK. The fifth sampler SMP5 may sample the sixth signal S6 at a point in time of the rising edge of the clock signal CK and may output the current data bit D[n]. A value of the current data bit D[n] may be "0."

In the time interval corresponding to the first next data bit D[n+1], the second multiplexer MUX2 may select the first signal S1 among the first signal S1 and the second signal S2 based on that a value of the first current data bit D[n] is "0." That is, when the value of the result sampled based on the rising edge of the clock signal CK is "0", the second multiplexer MUX2 may output the second signal S2 as a signal to be sampled based on the falling edge of the clock signal CK. The third sampler SMP3 may sample the first signal S1 at a point in time of the falling edge of the clock signal CK and may output the first next data bit D[n+1]. A value of the first next data bit D[n+1] may be "1."

When the value of the first next data bit D[n+1] is "1", in the time interval corresponding to the second next data bit D[n+2], the fourth multiplexer MUX4 may output the sixth signal S6. That is, when the value of the result sampled based on the falling edge of the clock signal CK is "1," the fourth multiplexer MUX4 may output the sixth signal S6 as a signal to be sampled based on the rising edge of the clock signal CK. The fifth sampler SMP5 may sample the sixth signal S6 at a point in time of the rising edge of the clock signal CK and may output the second next data bit D[n+2]. A value of the second next data bit D[n+2] may be "1."

When the value of the second next data bit D[n+2] is "1," in the time interval corresponding to the third next data bit D[n+3], the second multiplexer MUX2 may output the second signal S2. That is, when the value of the result sampled based on the rising edge of the clock signal CK is "1," the second multiplexer MUX2 may output the second signal S2 as a signal to be sampled based on the falling edge of the clock signal CK. The third sampler SMP3 may sample the second signal S2 at a point in time of the falling edge of the clock signal CK and may output the third next data bit D[n+3]. A value of the third next data bit D[n+3] may be "1."

Referring to the output signal OS of the DFE 100d, there are illustrated the first previous data bit D[n−1] output as a result of sampling the first signal S1, the current data bit D[n] output as a result of sampling the sixth signal S6, the first next data bit D[n+1] output as a result of sampling the second signal S2, the second next data bit D[n+2] output as a result of sampling the sixth signal S6, and the third next data bit D[n+3] output as a result of sampling the first signal S1.

Comparing the output signal OS of the DFE 100d and the processed signal of FIG. 2, the width of the valid data window of the output signal OS that the DFE 100d outputs may become greater. That is, the DFE 100d may generate the output signal OS similar to the raw signal illustrated in FIG. 2, by removing the ISI of the processed signal.

Figure 17:
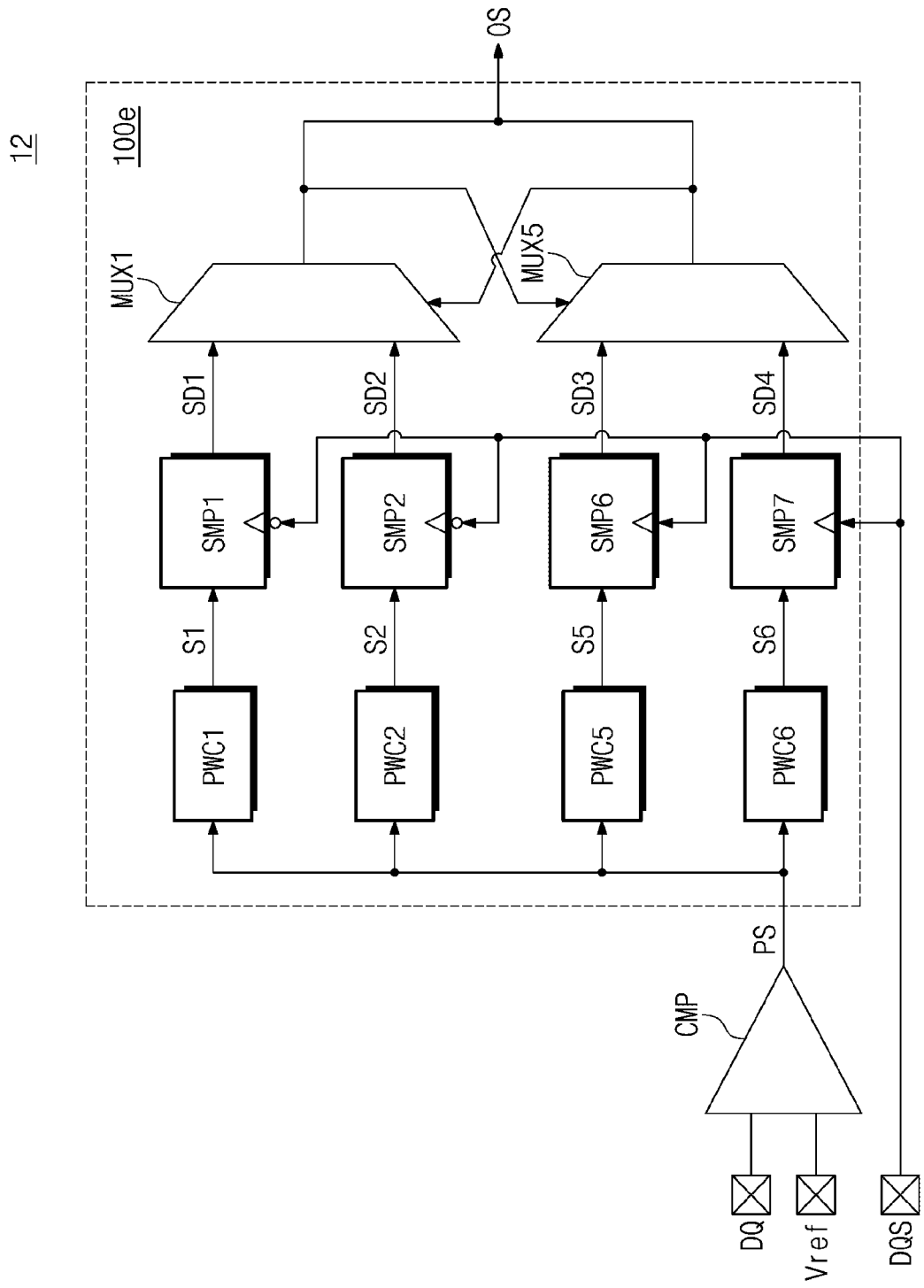
FIG. 17 is a block diagram illustrating a memory device according to an embodiment of the present disclosure.

FIG. 17 is a block diagram illustrating a memory device according to an embodiment of the present disclosure. Referring to FIGS. 1 and 17, the memory device 12 may include the comparator CMP and a DFE 100e. DFE 100e can be implemented as an equalizer. For convenience of description and for brevity of illustration, components of the memory device 12 are conceptually illustrated, and some unnecessary components are omitted. The DFE 100e may correspond to the DFE 100 of FIG. 1 and the DFE 100a of FIG. 4. The comparator CMP, the first pulse width controller PWC1, the second pulse width controller PWC2, the first sampler SMP1, the second sampler SMP2, and the first multiplexer MUX1 of FIG. 17 may respectively correspond to the comparator CMP, the first pulse width controller PWC1, the second pulse width controller PWC2, the first sampler SMP1, the second sampler SMP2, and the first multiplexer MUX1 of FIG. 4.

The comparator CMP may be configured to generate the processed signal PS based on the reference voltage Vref by comparing the data signal received from the memory controller 11 with the reference voltage Vref.

Below, a structure of the DFE 100e will be described. The DFE 100e may be configured to perform the ISI removing operation on the processed signal PS corresponding to the current data bit D[n] and may output the output signal OS. The DFE 100e may include the first pulse width controller PWC1, the second pulse width controller PWC2, the fifth pulse width controller PWC5, the sixth pulse width controller PWC6, the first sampler SMP1, the second sampler SMP2, a sixth sampler SMP6, a seventh sampler SMP7, the first multiplexer MUX1, and a fifth multiplexer MUX5.

Also, the DFE 100e may be configured to operate based on the double data rate (DDR). The DFE 100a of FIG. 4 may receive one data bit every point in time of the rising edge of the data strobe signal; in contrast, the DFE 100e of FIG. 17 may receive one data bit every point in time of the rising edge of the clock signal CK (or the data strobe signal) and may receive one data bit every point in time of the falling edge of the clock signal CK (or the data strobe signal).

The first pulse width controller PWC1 may be configured to generate the first signal S1 by increasing the pulse width of the processed signal PS, which corresponds to the first logic level, as much as the first time interval. The second pulse width controller PWC2 may be configured to generate the second signal S2 by increasing the pulse width of the processed signal PS, which corresponds to the second logic level, as much as the first time interval.

The fifth pulse width controller PWC5 may be configured to generate the fifth signal S5 by increasing the pulse width of the processed signal PS, which corresponds to the first logic level, as much as the first time interval. The fifth pulse width controller PWC5 may operate to be identical to the first pulse width controller PWC1.

The sixth pulse width controller PWC6 may be configured to generate the sixth signal S6 by increasing the pulse width of the processed signal PS, which corresponds to the second logic level, as much as the first time interval. The sixth pulse width controller PWC6 may operate to be identical to the second pulse width controller PWC2.

The first sampler SMP1 may be configured to generate the first sampled signal SD1 from the first signal S1 based on the point in time of the falling edge of the data strobe signal. The second sampler SMP2 may be configured to generate the second sampled signal SD2 from the second signal S2 based on the point in time of the falling edge based on the data strobe signal. The sixth sampler SMP6 may be configured to generate a third sampled signal SD3 from the fifth signal S5 based on the data strobe signal. The seventh sampler SMP7 may be configured to generate a fourth sampled signal SD4 from the sixth signal S6 based on the data strobe signal. That is, the sixth and seventh samplers SMP6 and SMP7 may operate based on the point in time of the rising edge of the data strobe signal.

The first multiplexer MUX1 may be configured to output one of the first sampled signal SD1 and the second sampled signal SD2 based on an output of the fifth multiplexer MUX5. In some embodiments, when the bit output from the fifth multiplexer MUX5 has the first value, the first multiplexer MUX1 may output the second sampled signal SD2. For example, the first value may be "1," When the bit output of the fifth multiplexer MUX5 has the second value, the first multiplexer MUX1 may output the first sampled signal SD1. For example, the second value may be "0." That is, the first multiplexer MUX1 may output the first sampled signal SD1 or the second sampled signal SD2 based on a signal sampled at the point in time of the rising edge of the data strobe signal. As such, even data may be selected based on a result of sampling odd data.

The fifth multiplexer MUX5 may be configured to output one of the third sampled signal SD3 and the fourth sampled signal SD4 based on an output of the first multiplexer MUX1. In some embodiments, when the bit output of the first multiplexer MUX1 has the first value, the fifth multiplexer MUX5 may be configured to output the fourth sampled signal SD4. For example, the first value may be "1," When the bit output of the first multiplexer MUX1 has the second value, the fifth multiplexer MUX5 may output the third sampled signal SD3. For example, the second value may be "0." That is, the fifth multiplexer MUX5 may output the third sampled signal SD3 or the fourth sampled signal SD4 based on a signal sampled at the point in time of the falling edge of the data strobe signal. As such, odd data may be selected based on a result of sampling even data.

According to an embodiment of the present disclosure, a memory device may remove or reduce an inter symbol interference (ISI) of a data signal by increasing a pulse width corresponding to each of a logic low level and a logic high level of the data signal.

Also, the reliability of the memory device may be improved by securing a valid margin for identifying the data bit.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An equalizer comprising:
a first pulse width controller configured to generate a first signal by increasing a first pulse width of a first data signal having a first logic level, the first data signal corresponding to a current data bit;
a second pulse width controller configured to generate a second signal by increasing a second pulse width of the first data signal having a second logic level;
a first sampler configured to generate a first sampled signal by sampling the first signal;
a second sampler configured to generate a second sampled signal by sampling the second signal; and
a multiplexer configured to output the first sampled signal or the second sampled signal based on a value of a previous data bit.

2. The equalizer of claim 1, wherein a second data signal corresponding to the previous data bit is received from a memory controller before a unit time period compared to the first data signal corresponding to the current data bit.

3. The equalizer of claim 1, wherein the multiplexer is further configured to:
output the second sampled signal when the previous data bit has a first value; and
output the first sampled signal when the previous data bit has a second value.

4. The equalizer of claim 1, wherein the first sampler is further configured to:
generate the first sampled signal by sampling the first signal based on a point in time of a rising edge of a data strobe signal, and
wherein the second sampler is further configured to:
generate the second sampled signal by sampling the second signal based on the point in time of the rising edge of the data strobe signal.

5. The equalizer of claim 1, wherein the first pulse width controller is further configured to:
increase the first pulse width as much as a first time interval, and
wherein the second pulse width controller is further configured to:
increase the second pulse width as much as the first time interval.

6. An equalizer comprising:
a first pulse width controller configured to generate a first signal by increasing a first pulse width of a first data signal having a first logic level, the first data signal corresponding to a current data bit;
a second pulse width controller configured to generate a second signal by increasing a second pulse width of the first data signal having a second logic level;
a first multiplexer configured to output the first signal or the second signal based on a value of a first previous data bit; and
a first sampler configured to sample a signal output from the first multiplexer.

7. The equalizer of claim 6, wherein a second data signal corresponding to the first previous data bit is received from a memory controller before a unit time period compared to the first data signal corresponding to the current data bit.

8. The equalizer of claim 6, wherein the first multiplexer is further configured to:
output the second signal when the first previous data bit has a first value; and
output the first signal when the first previous data bit has a second value.

9. The equalizer of claim 6, wherein the first sampler is further configured to:
generate the current data bit by sampling the signal output from the first multiplexer based on a point in time of a rising edge of a data strobe signal.

10. The equalizer of claim 6, wherein the first pulse width controller is further configured to:
increase the first pulse width of the first data signal as much as a first time interval, and
wherein the second pulse width controller is further configured to:

increase the second pulse width of the first data signal as much as the first time interval.

11. The equalizer of claim 10, further comprising:
a third pulse width controller configured to generate a third signal by increasing the first pulse width as much as a second time interval;
a fourth pulse width controller configured to generate a fourth signal by increasing the second pulse width as much as the second time interval; and
a control circuit configured to generate a control signal based on a value of the first previous data bit and a value of a second previous data bit,
wherein the first multiplexer is further configured to:
output one of the first to fourth signals based on the control signal.

12. The equalizer of claim 11, wherein a third data signal corresponding to the second previous data bit is received from a memory controller before a unit time period compared to a second data signal corresponding to the first previous data bit.

13. The equalizer of claim 11, wherein the second time interval is longer than the first time interval.

14. The equalizer of claim 11, wherein the first multiplexer is further configured to:
output the third signal when the control signal indicates that the first previous data bit has a second value and the second previous data bit has the second value;
output the first signal when the control signal indicates that the first previous data bit has the second value and the second previous data bit has a first value;
output the second signal when the control signal indicates that the first previous data bit has the first value and the second previous data bit has the second value; and
output the fourth signal when the control signal indicates that the first previous data bit has the first value and the second previous data bit has the first value.

15. The equalizer of claim 6, further comprising:
a third pulse width controller configured to generate a third signal by increasing the first pulse width;
a fourth pulse width controller configured to generate a fourth signal by increasing the second pulse width;
a second multiplexer configured to output the third signal or the fourth signal based on a signal output from the first sampler; and
a second sampler configured to sample a signal output from the second multiplexer,
wherein the first sampler is further configured to;
sample the signal output from the first multiplexer based on a point in time of a falling edge of a data strobe signal, and
wherein the second sampler is further configured to:
sample the signal output from the second multiplexer based on a point in time of a rising edge of the data strobe signal.

16. The equalizer of claim 15, wherein the second multiplexer is further configured to:
output the fourth signal when the signal output from the first multiplexer has a first value; and
output the third signal when the signal output from the first multiplexer has a second value.

17. The equalizer of claim 15, wherein each of the first pulse width controller and the third pulse width controller is further configured to:
increase the first pulse width as much as a first time interval, and
wherein each of the second pulse width controller and the fourth pulse width controller is further configured to:
increase the second pulse width as much as the first time interval.

18. An equalizer comprising:
a first pulse width controller configured to generate a first signal by increasing a first pulse width of a first data signal having a first logic level, the first data signal corresponding to a current data bit;
a second pulse width controller configured to generate a second signal by increasing a second pulse width of the first data signal having a second logic level;
a third pulse width controller configured to generate a third signal by increasing the first pulse width;
a fourth pulse width controller configured to generate a fourth signal by increasing the second pulse width;
a first sampler configured to generate a first sampled signal by sampling the first signal based on a point in time of a falling edge of a data strobe signal;
a second sampler configured to generate a second sampled signal by sampling the second signal based on the point in time of the falling edge of the data strobe signal;
a third sampler configured to generate a third sampled signal by sampling the third signal based on a point in time of a rising edge of the data strobe signal;
a fourth sampler configured to generate a fourth sampled signal by sampling the fourth signal based on the point in time of the rising edge of the data strobe signal;
a first multiplexer configured to output the first sampled signal or the second sampled signal based on a signal output from a second multiplexer; and
a second multiplexer configured to output the third sampled signal or the fourth sampled signal based on a signal output from the first multiplexer.

19. The equalizer of claim 18, wherein the first multiplexer is further configured to:
output the second sampled signal when the signal output from the second multiplexer has a first value; and
output the first sampled signal when the signal output from the second multiplexer has a second value, and
wherein the second multiplexer is further configured to:
output the fourth sampled signal when the signal output from the first multiplexer has the first value; and
output the third sampled signal when the signal output from the first multiplexer has the second value.

20. The equalizer of claim 18, wherein each of the first pulse width controller and the third pulse width controller is further configured to:
increase the first pulse width as much as a first time interval, and
wherein each of the second pulse width controller and the fourth pulse width controller is further configured to:
increase the second pulse width as much as the first time interval.

* * * * *